United States Patent
Fukuta et al.

(10) Patent No.: US 9,240,739 B2
(45) Date of Patent: Jan. 19, 2016

(54) DRIVING SYSTEM FOR DRIVING SWITCHING ELEMENT

(71) Applicant: DENSO CORPORATION, Kariya-city, Aichi-pref. (JP)

(72) Inventors: Junichi Fukuta, Kuwana (JP); Tsuneo Maebara, Nagoya (JP)

(73) Assignee: DENSO CORPORATION, Kariya (JP)

( * ) Notice: Subject to any disclaimer, the term of this patent is extended or adjusted under 35 U.S.C. 154(b) by 94 days.

(21) Appl. No.: 14/172,945

(22) Filed: Feb. 5, 2014

(65) Prior Publication Data
US 2014/0217942 A1    Aug. 7, 2014

(30) Foreign Application Priority Data

Feb. 5, 2013   (JP) ................................. 2013-020755

(51) Int. Cl.
| | |
|---|---|
| H02P 6/14 | (2006.01) |
| H02M 7/5387 | (2007.01) |
| H02M 1/08 | (2006.01) |
| H02M 1/38 | (2007.01) |
| H03K 17/78 | (2006.01) |

(52) U.S. Cl.
CPC ............ *H02M 7/53875* (2013.01); *H02M 1/08* (2013.01); *H02M 1/38* (2013.01); *H03K 17/78* (2013.01)

(58) Field of Classification Search
CPC ................................. H02M 1/38; H02M 1/385
USPC ..................................................... 318/400.27
See application file for complete search history.

(56) References Cited

U.S. PATENT DOCUMENTS

2012/0020120 A1    1/2012    Yanagita

FOREIGN PATENT DOCUMENTS

| | | |
|---|---|---|
| JP | 2004-040977 | 2/2004 |
| JP | 2010-142074 | 6/2010 |
| JP | 2011-101466 | 5/2011 |
| JP | 2011-188624 | 9/2011 |
| JP | 2011-217022 | 10/2011 |
| JP | 2012-023810 | 2/2012 |
| JP | 2012-050234 | 3/2012 |
| JP | 2013-21748 | 1/2013 |

OTHER PUBLICATIONS

Office Action (3 pgs.) dated Mar. 3, 2015 issued in corresponding Japanese Application No. 2013-020755 with an at least partial English translation thereof (5 pgs.).

*Primary Examiner* — Erick Glass
(74) *Attorney, Agent, or Firm* — Nixon & Vanderhye PC

(57) ABSTRACT

In a driving system, an applying module applies, in response to an input of an on or off command as a switching command, a switch signal to a target switching element as a high- or low-side switching element to switch the target switching element to be an on or off state. A measuring module measures a delay period defined as a time interval from a first time to a second time. The first time represents a time at which the switching command is switched from one of the on command and the off command to the other. The second time represents a time at which the target switching element is actually switched to be the on or off state. An adjusting module adjusts, based on the delay period, an input timing of a next switch signal applied from the applying module to the target switching element.

13 Claims, 13 Drawing Sheets

- $DT* = DTr + Toffr - Tonr$
- $DT* = DTr$
  $\Rightarrow Tonr = Toffr$

FIG.5A v*#
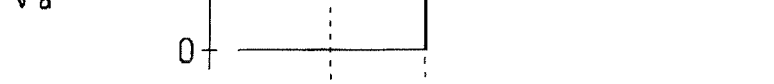
FIG.5B Va
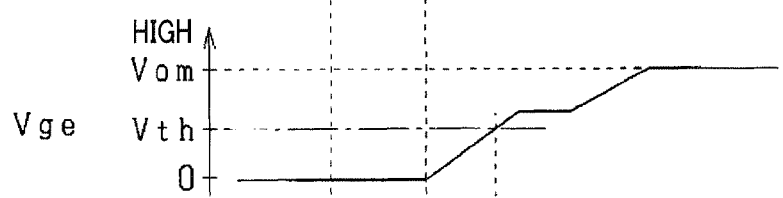
FIG.5C Vge
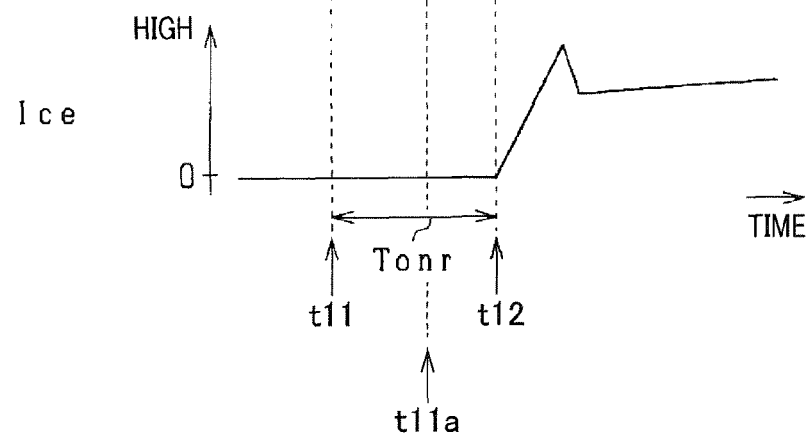
FIG.5D Ice

FIG.11A v*#
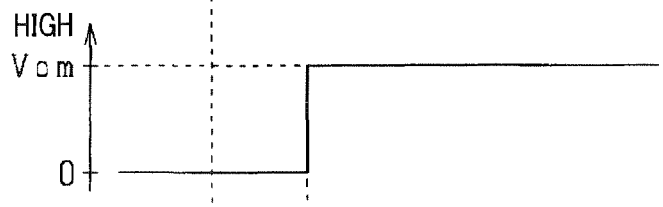
FIG.11B Va
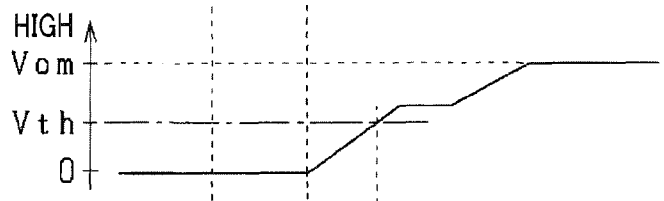
FIG.11C Vge
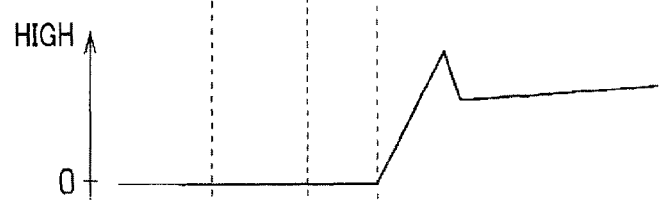
FIG.11D Ice
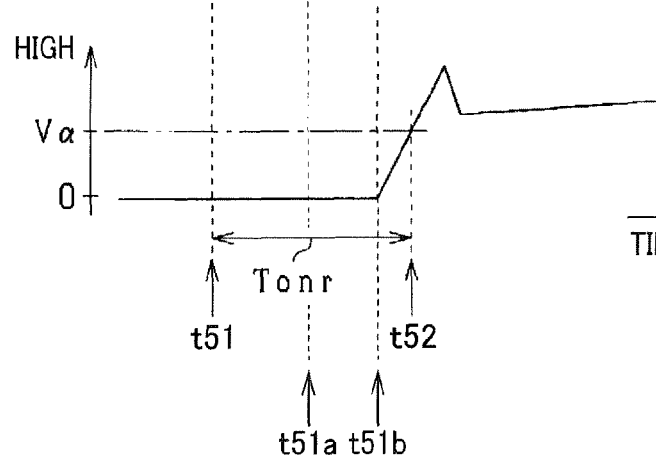
FIG.11E Vse

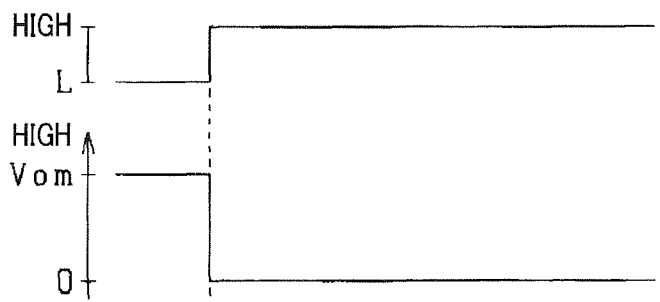
FIG.12A
FIG.12B
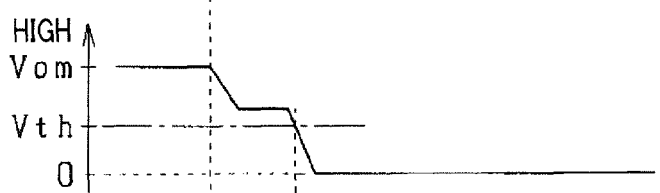
FIG.12C
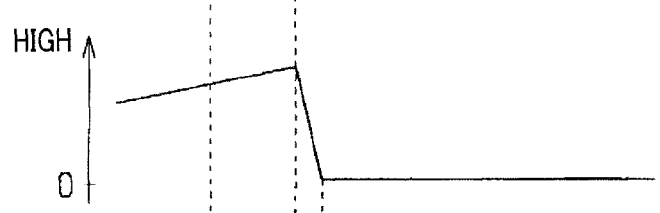
FIG.12D
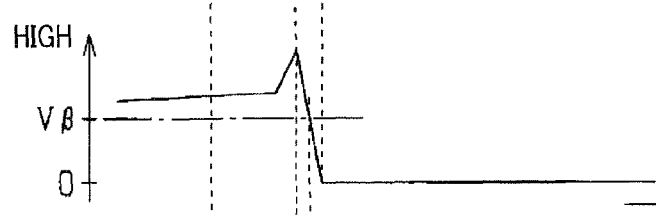
FIG.12E

DRIVING SYSTEM FOR DRIVING SWITCHING ELEMENT

CROSS REFERENCE TO RELATED APPLICATIONS

This application is based on and claims the benefit of priority from Japanese Patent Application 2013-020755 filed on Feb. 5, 2013, the disclosure of which is incorporated in its entirety herein by reference.

TECHNICAL FIELD

The present disclosure relates to driving systems for driving series-connected high- and low-side switching elements of a power converter.

BACKGROUND

In power converters, series-connected high- and low-side switching elements are alternately turned on, which converts direct-current (DC) power input from a DC power source into different power, such as alternating-current (AC) power.

In these power converters, there is a technology to prevent the series-connected high- and low-side switching element from being simultaneously turned on, thus prohibiting a high-level through current from flowing through the high- and low-side switching elements. This technology is designed to turn off one of the high- and low-side switching elements, delay turn-on of the other thereof by a dead time from the turn-off timing, and turn on the other thereof after lapse of the dead time.

Introducing the dead time prevents the occurrence of a through current, but it may reduce the power conversion efficiency of the power converter. For this reason, it is important how the dead time should be determined in view of both the reliability and power conversion efficiency of the power converter.

On the other hand, there is a time lag between a falling point of time of a gate voltage for an IGBT, which is an example of a voltage-driven switching element, in response to an off command and a point of time when a collector current flowing through the IGBT actually falls down to a preset threshold value. Such a time lag will be referred to as a turn-off delay period. Turn-off delay periods for an IGBT are included in respective dead times therefor. For this reason, there are technologies for adjusting a turn-off delay period to adjust a corresponding dead time, one of which is disclosed in Japanese Patent Application Publication No. 2010-142074.

Note that turn-off delay periods of a switching element vary depending on values of parameters including a collector-emitter voltage, a collector current, switching-element's temperature; the values of the parameters occur during the respective turn-off delay periods. For this reason, each turn-off delay period is set to include a margin that allows the maximum change of each parameter, resulting in an increase of a corresponding dead time.

In view of the circumstances, the technology disclosed in the Patent Publication No. 2010-142074 stores a map representing the turn-off delay periods of a switching element of a power converter each correlating with values of the parameters. The technology obtains actual values of the parameters, and refers, for every switching cycle of a target switching element that should be turned on, to the map using the actual values of the parameters to obtain an actual turn-off delay period of the target switching element. Then, the technology corrects, based on the actual turn-off delay period, an initial value of a corresponding dead time between the target switching element and a switching element series connected thereto, and this correction is performed for every switching cycle; the initial value of the dead time contains a margin set forth above. This results in a reduction of a dead time defined between a corresponding on state of the target switching element and an on state of a switching element series connected thereto for each switching cycle.

SUMMARY

As described above, the technology disclosed in the Patent Publication No. 2010-142074 requires the actual values of the parameters including the collector-emitter voltage, the collector current, and the switching-element's temperature in obtaining an actual turn-off delay period of each switching element in order to adjust a corresponding dead time. This may increase the number of circuit components required to obtain actual values of these parameters, and make complicated the circuit structure to adjust dead times between each switching element and a switching element series connected thereto over switching cycles.

In view of the circumstances set forth above, one aspect of the present disclosure seeks to provide driving systems for a switching element, which are designed to address the problems set forth above.

Specifically, an alternative aspect of the present disclosure aims to provide such driving systems, each of which is capable of reducing variations in dead times between series-connected high- and low-side switching elements over switching cycles without its circuit structure being complicated.

According to an exemplary aspect of the present disclosure, there is provided a driving system for driving series-connected high- and low-side switching elements of a power converter to alternately turn on the series-connected high- and low-side switching elements with dead time between on states of the respective high- and low-side switching elements. The driving system includes an applying module configured to apply, in response to an input of one of an on command and an off command as a switching command, a switch signal to a target switching element as one of the high- and low-side switching elements to switch the target switching element to be in one of an on state and an off state corresponding to the switching command. The driving system includes a measuring module configured to measure a delay period defined as a time interval from a first time to a second time. The first time represents a time at which the switching command is switched from one of the on command and the off command to the other thereof, and the second time represents a time at which the target switching element is actually switched to be in one of the on state and off state corresponding to the switching command. The driving system includes an adjusting module configured to adjust, as a function of the delay period, an input timing of a next switch signal applied from the applying module to the target switching element.

In the driving system according to the exemplary aspect, the measuring module measures the delay period defined as the time interval from the first time to the second time. The first time represents a time at which the switching command is switched from one of the on command and the off command to the other thereof, and the second time represents a time at which the target switching element is actually switched to be in one of the on state and off state corresponding to the switching command. That is, the delay period shows an actual delay period required for the target switching element to be actually switched in response to the switching command being switched from one of the on command and the off command to the other thereof. The adjusting module adjusts, as the function of the delay period, the input timing of a next switch signal applied from the applying module to the target switching element.

This permits an actual delay period required to switch the target switching element according to the next switch signal to match with the delay period required to switch the target switching element according to the switch signal. This reduces variations in the delay periods required to switch the target switching element according to the switch signal and the next switch signal, thus reducing variations in dead times including the respective delay periods.

The above and/or other features, and/or advantages of various aspects of the present disclosure will be further appreciated in view of the following description in conjunction with the accompanying drawings. Various aspects of the present disclosure can include and/or exclude different features, and/or advantages where applicable. In addition, various aspects of the present disclosure can combine one or more feature of other embodiments where applicable. The descriptions of features, and/or advantages of particular embodiments should not be construed as limiting other embodiments or the claims.

BRIEF DESCRIPTION OF THE DRAWINGS

Other aspects of the present disclosure will become apparent from the following description of embodiments with reference to the accompanying drawings in which:

FIGS. 5A to 5D are a joint timing chart schematically illustrating how to measure an on delay time according to the first embodiment;

FIGS. 11A to 11E are a joint timing chart schematically illustrating how to measure the on delay time according to a second embodiment of the present disclosure;

FIGS. 12A to 12E are a joint timing chart schematically illustrating how to measure the off delay time according to the second embodiment;

DETAILED DESCRIPTION OF EMBODIMENT

Figure 1:
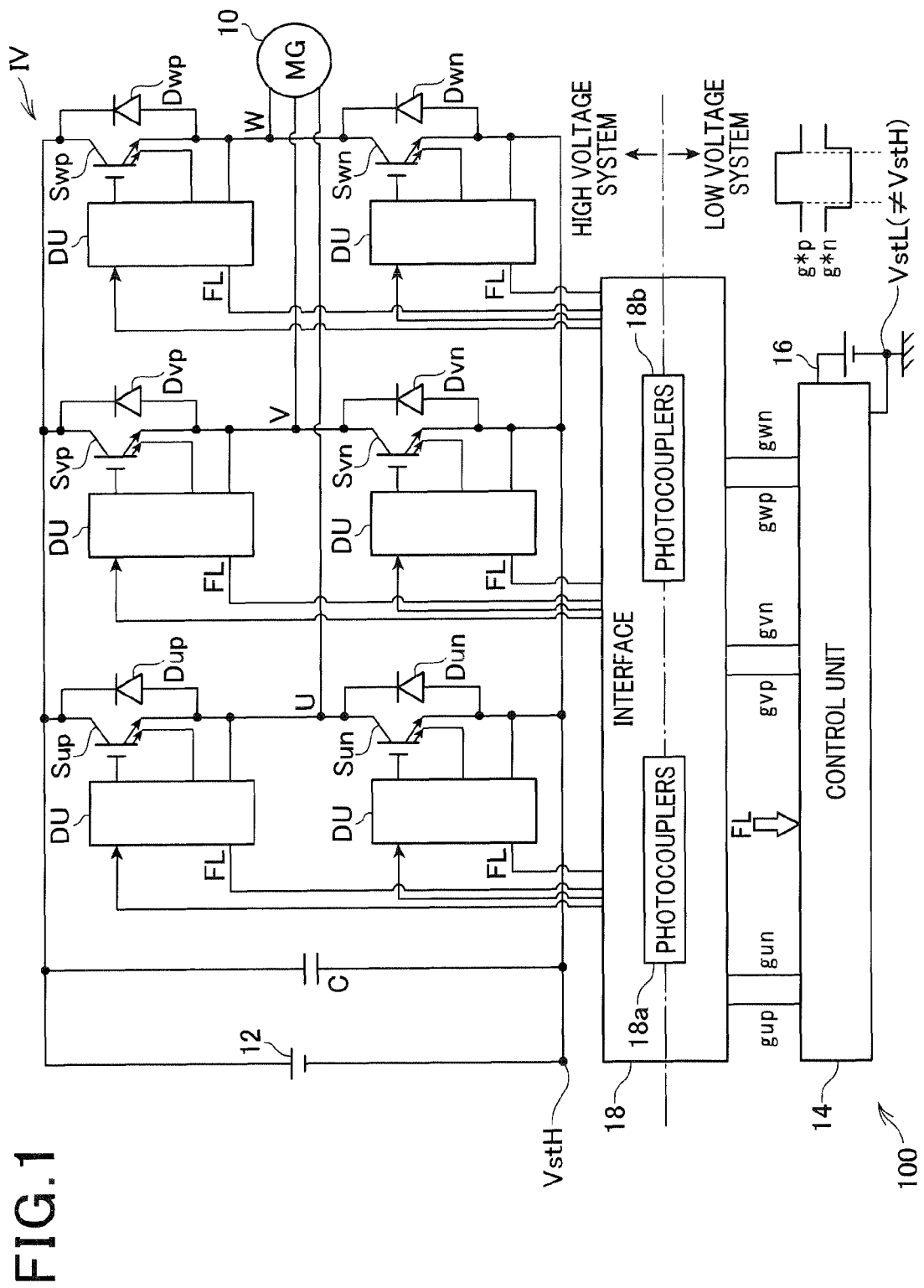
FIG. 1 is a view schematically illustrating an overall configuration of a control system for a motor-generator according to a first embodiment of the present disclosure.

Embodiments of the present disclosure will be described hereinafter with reference to the accompanying drawings. In the embodiments, like parts between the embodiments, to which like reference characters are assigned, are omitted or simplified in description to avoid redundant description.

First Embodiment

Referring to FIG. 1, there is illustrated a three-phase motor-generator as an example of rotating machines, referred to simply as a "motor-generator" 10, installed in, for example, a hybrid vehicle comprised of an internal combustion engine according to a first embodiment; the motor-generator 10 serves as a main engine of the hybrid vehicle. The motor-generator 10 is mechanically coupled to driving wheels (not shown) of the hybrid vehicle.

The motor-generator 10 is comprised of, for example, a rotor including a magnetic field and a stator including three-phase windings, i.e. U-, V-, and W-phase windings. The rotor of the motor-generator 10 is rotated based on magnetic interaction between the magnetic field of the rotor and a rotating field generated by the three-phase windings when the three-phase windings are energized. For example, the three-phase windings (U-, V-, and W-phase windings) each have one end connected to a common junction (neutral point) and the other end to a separate terminal in, for example, a star-configuration.

In FIG. 1, there is also illustrated a control system 100 for controlling the motor-generator 10. The control system 100 is equipped with an inverter IV, a capacitor C, a high-voltage battery 12 serving as a DC power source, drive units DU, a control unit 14, a low-voltage battery 16, and an interface 18.

To the motor-generator 10, the high-voltage battery 12 is electrically connected via the capacitor C and the inverter IV. The high-voltage battery 12 has a terminal voltage Vom, which is equal to or higher than 100 V, thereacross.

The capacitor C is connected in parallel to the high-voltage battery 12 and to the inverter IV. The capacitor C is operative to smooth the terminal voltage across the high-voltage battery 12.

The inverter IV is designed as a three-phase inverter. The inverter IV is provided with three pairs of series-connected high- and low-side (upper- and lower-arm) switching elements Sup and Sun, Svp and Svn, and Swp and Swn. The inverter IV is also provided with flywheel diodes Dup and Dun, Dvp and am, and Dwp and Dwn electrically connected in antiparallel to the corresponding switching elements Sup and Sun, Svp and Svn, and Swp and Swn, respectively.

In the first embodiment, as the switching elements S*# u, v, w, #=p, n), IGBTs are respectively used.

When power MOSFETs are used as the switching elements S*# (*=u, v, w, #=p, n), intrinsic diodes of the power MOSFETs can be used as the flywheel diodes, thus eliminating the flywheel diodes.

The three pairs of switching elements are parallelly connected to each other in bridge configuration. A connecting point through which each of the switching elements S*p is connected to a corresponding one of the elements S*n in series is connected to a busbar and a high-voltage cable extending from the separate terminal of a corresponding one of the U-phase winding, V-phase winding, and W-phase winding. One end of the series-connected switching elements of each of the three pairs, such as the collector of the corresponding high-side switching element, is connected to the positive terminal of the high-voltage battery 12 via the positive DC input line. The other end of the series-connected switching elements of each of the three pairs, such as the emitter of the corresponding low-side switching element, is connected to the negative terminal of the high-voltage battery 12 via the negative DC input line. For example, the three-phase busbars of the three-phase connecting points of the inverter IV are connected to corresponding three-phase output terminals of a terminal holder, respectively. The three-phase output terminals of the terminal holder are connected to the three-phase high-voltage cables, respectively.

For example, the control unit 14 is comprised of a microcomputer as its main component, and operates based on a power-supply voltage, lower than the terminal voltage across the high-voltage battery 12, supplied from the low-voltage battery 16. Thus, the control unit 14 and the low-voltage battery 16 constitute a low voltage system. In contrast, the motor-generator 10, the inverter IV, and the high-voltage battery 12 constitute a high voltage system. In other words, the control unit 14 and the low-voltage battery 16 are provided in a low-side circuit region, i.e. a first circuit region, and the motor-generator 10, the inverter IV, and the high-voltage battery 12 are provided in a high-side circuit region, i.e. a second circuit region.

The interface 18 is provided with insulation members, such as a pair of first and second photocouplers 18a and 18b, provided for the respective switching elements S*# of the inverter IV. The photocouplers 18a and 18b are configured to enable communications between the high and low voltage systems while establishing electrical insulation therebetween, i.e. between the first circuit region and the second circuit region. Specifically, the first and second photocouplers 18a and 18b of each pair are configured to enable the control unit 14 to control a corresponding one of the switching elements S*# while establishing electrical insulation between the control unit 14 and a corresponding one of the switching elements S*#.

In the first embodiment, the high voltage system has a reference voltage level, i.e. a reference potential, VstH to which the potential at the negative terminal of the high-voltage battery 12 is set. The low voltage system also has a reference voltage level, i.e. a reference potential, VstL to which the intermediate potential between the potential at the positive terminal of the high-voltage battery 12 and that at the negative terminal thereof is set; the intermediate potential corresponds to the potential at the body of the hybrid vehicle.

The control unit 14 is designed to drive the inverter IV to thereby control a controlled variable of the motor-generator 10, such as an output torque of the motor-generator 10.

Specifically, the control unit 14 is designed to individually send drive signals gup, gun, gvp, gvn, gwp, and gwn to the drive units DU provided for the respective switching elements Sup, Sun, Svp, Swp, and Swn, thus individually turning on or off the respective switching elements Sup, Sun, Svp, Svn, Swp, and Swn. The individual turn-on or off of the respective switching elements Sup, Sun, Svp, Svn, Swp, and Swn convert the output DC voltage across the capacitor C into an AC voltage, and supply the AC voltage to the motor-generator 10.

Each of the drive signals g*# has a predetermined duty cycle, i.e. a predetermined ratio of on duration to the total duration of each switching cycle for a corresponding one of the switching elements S*# (see FIG. 1). Specifically, the control unit 14 is designed to complementarily turn on the high- and low-side switching elements S*# for each leg (phase) via the corresponding drive units DU according to the corresponding drive signals g*#. In other words, the control unit 14 is designed to alternately turn on the high-side switching element S*p of one leg (phase) and the low-side switching element S*n of the same leg (phase). This drive alternately closes the conductive path between the collector and emitter of the high-side switching element S*p of one leg and the conductive path between the collector and emitter of the high-side switching element S*n of the same leg.

Next, an example of the circuit structure of each drive unit DU provided for a corresponding one switching element S*# will be described with reference to FIG. 2.

Figure 2:
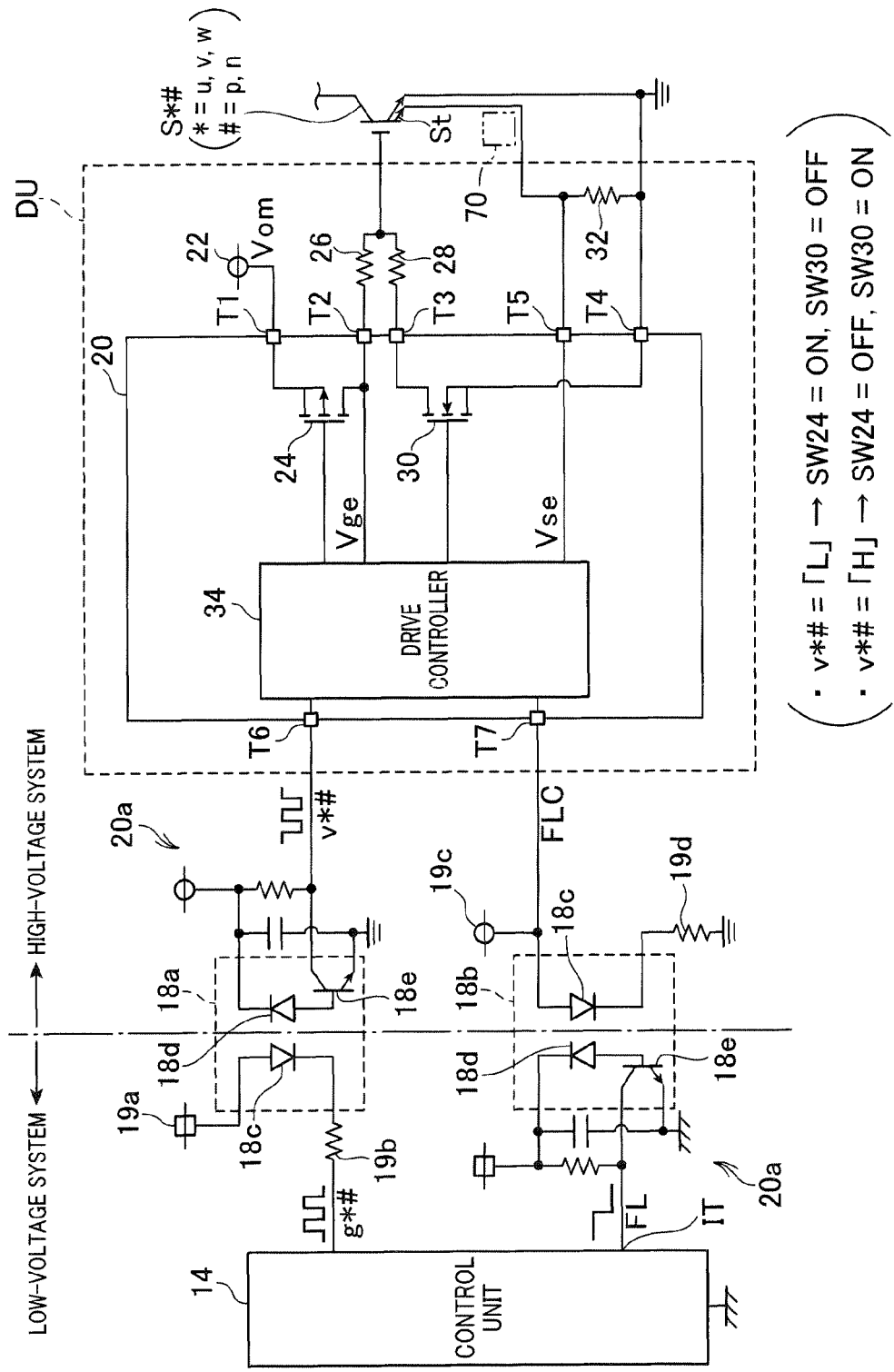
FIG. 2 is a circuit diagram schematically illustrating an example of the structure of each drive unit of the control system illustrated in FIG. 1.

Referring to FIG. 2, the drive unit DU is comprised of a drive IC 20 constructed by a semiconductor integrated circuit mounted on/in, for example, a single chip; a constant voltage power source 22; a charging resistor 26; a discharging resistor 28; and a sense resistor 32.

The drive IC 20 has terminals T1 to T7, a charging switching element (SW) 24, a discharging switching element (SW) 30, and a drive controller 34. As the charging switching element 26, a P-channel MOSFET is used. In contrast, as the discharging switching element 30, an N-channel MOSFET is used.

The constant voltage power source 22 having a terminal voltage Vom of, for example, 15 V thereacross is connected to the first terminal T1. The constant voltage power source 22 serves as a power source to generate a voltage to be applied to the on-off control terminal, i.e. the gate, of the switching element S*#. To the first terminal T1, a first end, i.e. the source, of the charging switching element 24 is connected. A second end, i.e. the drain, of the charging switching element 24 is connected to the second terminal T2. The charging switching element 24 has a conductive path between the first and second ends. To the second terminal T2, the gate of the switching element S*# is connected via the charging resistor 26. To the second terminal T2, the drive controller 34 is also connected.

The gate of the switching element S*# is also connected to the third terminal T3 via the discharging resistor 28. To the third terminal T3, a first end, i.e. the drain, of the discharging switching element 30 is connected. A second end, i.e. the source, of the discharging switching element 26 is connected to the fourth terminal T4. The discharging switching element 26 has a conductive path between the first and second ends. The fourth terminal T4 is connected to, for example, a common potential line. The common potential line is connected to the output terminal, i.e. the emitter, of the switching element S*#. In this embodiment, the potential at the emitter of the switching element S*# is set to 0 V.

The switching element S*# has a sense terminal St for outputting a minute current, i.e. a sense current, associated with a current, i.e. a collector current Ice, flowing through the conductive path between the input terminal and the output terminal thereof, i.e. between the collector and the emitter thereof. For example, the magnitude of the minute current is 0.01% of that of the collector current Ice.

The sense terminal St is connected to a first end of the sense resistor 32, and a second end, opposing the first end, of the sense resistor 32 is connected to the emitter of the switching element S*# via the common potential line.

When the collector current Ice flows through the conductive path of the switching element S*#, the sense current correlated with the collector current Ice flows through the sense resistor 32, so that a voltage drop across the sense resistor 32 occurs. Thus, it is possible to obtain the voltage drop across the sense resistor 32 as a sense voltage Vse at the first end of the sense resistor 32 connected to the sense terminal St; the sense voltage Vse is a parameter correlated with an electric state quantity of the magnitude of the collector current Ice flowing through the switching element S*#. That is, the level of the sense voltage Vse is as a function of, i.e. correlates with, the magnitude of the collector current Ice flowing through the switching element S*#.

In the first embodiment, the positive polarity of sense voltage Vse is defined when the potential at the first end of the sense resistor 32 connected to the sense terminal St is higher than the potential at the emitter of the switching element S*#. As described above, the potential at the emitter of the switching element S*# is set to zero. The first end of the sense resistor 32 is connected to the drive controller 34 via the fifth terminal T5, so that the sense voltage Vse is captured by the drive controller 34 via the fifth terminal T5.

The sixth terminal T6 of the drive IC 20 is connected to the control unit 14 via the first photocoupler 18a, and the seventh terminal T7 of the drive IC 20 is connected to the control unit 14 via the second photocoupler 18b.

As illustrated in FIG. 2, each of the first and second photocouplers 18a and 18b is comprised of, for example, a light-emitting photodiode 18c, a light-receiving photodiode 18d, and a bipolar transistor 18e. The base of the bipolar transistor 18e is connected to the anode of the light-receiving photodiode 18d, and the emitter is connected to a ground terminal.

The anode of the light-emitting photodiode 18c of the first photodiode 18a is connected to a constant voltage source 19a and the control unit 14, and the cathode is connected to a ground terminal of the control unit 14 via a resistor 19b and a MOS switching element (not shown).

Similarly, the anode of the light-emitting photodiode 18c of the second photodiode 18b is connected to a constant voltage source 19c and the seventh terminal T7, and the cathode is connected to a ground terminal of the interface 19 via a resistor 19d. The seventh terminal T7 is connected to a ground terminal via a MOS switching element (not shown) included in the drive controller 34.

The cathode of the light-receiving diode 18d and the collector of the bipolar transistor 18e of the first photocoupler 18a are connected to the sixth terminal T6 via a first pull-up/down circuit 20a. Similarly, the cathode of the light-receiving diode 18d and the collector of the bipolar transistor 18e of the second photocoupler 18b are connected to the control unit 14 via a second pull-up/down circuit 20b and an input terminal IT.

The control unit 14 is operative to output the drive signal g*# for the switching element S*# to the control terminal of the MOS switching element of the control unit 14. The drive signal g*# has one of a predetermined first logical level, i.e. a high level, and a predetermined second logical level, i.e. a low level, lower than the first logical level.

When the drive signal g*# is logically reversed from the low level to the high level, the MOS switching element of the control unit 14 is turned on. This causes electrical connection between the constant voltage source 19a and the ground terminal via the light-emitting diode 18c to be established, so that the light-emitting diode 18c emits light. The emitted light is received by the light-receiving diode 18d, so that the bipolar transistor 18e is turned on. The turn-on of the bipolar transistor 18e causes the first pull-up/down circuit 20a to connect the terminal T6 to the ground terminal, resulting in a drive signal v*# with a low level being output to the drive IC 20 via the sixth terminal T6.

On the other hand, when the drive signal g*# is logically reversed from the high level to the low level, electrical connection between the constant voltage source 19a and the ground terminal is interrupted, so that the light-emitting diode 18c emits no light. This results in turn-off of the bipolar transistor 18e. The turn-off of the bipolar transistor 18e causes the first pull-up/down circuit 20a to connect the sixth terminal T6 to a constant voltage source, resulting in the drive signal v*# with a high level being output to the drive IC 20 via the sixth terminal T6.

Specifically, the drive signal g*# output from the control unit 14 is input to the drive IC 20 as the drive signal v*# while the logical levels of the drive signal g*# and the drive signal v*# are reversed to each other.

The drive controller 34 is operative to receive the drive signal v*# via the sixth terminal T6, and perform a charging task for the gate of the switching element S*#, and a discharging task for the gate thereof using the drive signal v*# input thereto.

Note that, in the first embodiment, the drive signal g*# output from the control unit 14 represents:

an on command to shift the switching element S*# to be in an on state when it has the high level (H); and an off command to shift the switching element S*# to be in an off state when it has the low level (L).

This means that the drive signal input to the sixth terminal T6 represents:

an on command to shift the switching element S*# to be in an on state when it has the low level (L); and an off command to shift the switching element S*# to be in an off state when it has the high level (H).

Let us describe first the charging task for the gate of the switching element S*#.

When the drive signal v*# is changed to the on command, i.e. the low level, the drive controller 34 turns on the charging switching element 24 and turns off the discharging switching element 30. This charges the gate of the switching element S*# based on the terminal voltage Vom of the constant voltage power source 22 through the turn-on charging switching element 24 and the charging resistor 26.

Next, let us describe the discharging task for the gate of the switching element S*#.

When the drive signal v*# is changed to the off command, i.e. the high level, the drive controller 34 turns on the discharging switching element 30 and turns off the charging switching element 24. This discharges the gate of the switching element S*# through a discharging path based on the discharging resistor 28 and the turn-on discharging switching element 30.

As illustrated in FIG. 1, the drive controllers 34 of the drive units DU for the respective series-connected high- and low-side switching elements S*p and S*n are operative to perform the charging and discharging tasks for the respective series-connected high- and low-side switching elements S*p and S*n. As described in the BACKGROUND of the present application, the drive controller 34 of each drive unit DU for a high-side switching element S*p is configured to turn on the high-side switching element S*p after a dead time has elapsed since turn-off of the corresponding low-side switching element S*n. Similarly, the drive controller 34 of each drive unit DU for a low-side switching element S*n is configured to turn on the low-side switching element. S*n after dead time has elapsed since turn-off of the corresponding high-side switching element S*p. This prevents the occurrence of a through current through the series-connected switching elements S*p and S*n.

The drive controller 34 is also operative to perform a fail-safe task to send, to the control unit 14, information representing that there is an abnormality associated with the switching element S*# if such an abnormality occurs. Specifically, the drive controller 34 is operative to transfer a fail-safe signal FL representing that there is an abnormality associated with the switching element S*# to the control unit 14 via the seventh terminal T7 and the second photocoupler 18b if such an abnormality occurs.

Like the control unit 14, the drive controller 14 is operative to output a fail-safe command FLC having a logical high or low level to the control terminal of the MOS switching element of the drive controller 34.

When the fail-safe command FLC having the low level is input to the control terminal of the MOS switching element of the drive controller 34, the MOS switching element of the drive controller 34 is kept off, so that electrical connection between the constant voltage source 19c and the ground terminal via the light-emitting diode 18c is being established. This causes the light-emitting diode 18c to emit light based on the constant voltage of the constant voltage source 19c. The emitted light is received by the light-receiving diode 18d of the second photocoupler 18b, so that the bipolar transistor 18e of the second photocoupler 18b is turned on. The turn-on of the bipolar transistor 18e causes the second pull-up/down circuit 20b to connect the input terminal IT of the control unit 14 to the ground terminal, resulting in a fail-safe signal FL with a logical low level being input to the control unit 14 via the input terminal IT.

When the fail-safe command FLC is logically reversed from the low level to a high level, the MOS switching element of the drive controller 34 is turned on, so that electrical connection between the constant voltage source 19c and the ground terminal via the MOS switching element of the drive controller 34 is established. This causes the light-emitting diode 18c to emit no light, so that the bipolar transistor 18e of the second photocoupler 18b is turned off. The turn-off of the bipolar transistor 18e causes the second pull-up/down circuit 20b to connect the input terminal IT of the control unit 14 to a constant voltage source via a resistor, resulting in the fail-safe signal FL with a logical high level being input to the control unit 14 via the input terminal IT.

Specifically, the fail-safe command FLC output from the drive controller 34 is input to the control unit 14 as the fail-safe signal FL while the logical levels of the fail-safe command FLC and the fail-safe signal FL are kept to each other.

The fail-safe command FLC output from the drive controller 34 represents:

information indicative of the occurrence of an abnormality associated with the switching element when it has the high level (H); and information indicative of no abnormalities associated with the switching element S*# when it has the low level (L).

This means that the fail-safe signal FL input to the control unit 14 represents:

information indicative of the occurrence of an abnormality associated with the switching element S*# when it has the high level (H); and information indicative of no abnormalities associated with the switching element S*# when it has the low level (L).

The drive controller 34 is further operative to perform a delay-time adjusting task according to the first embodiment.

The delay-time adjusting task is installed in the drive controller 34 to reduce variations in the dead times required for preventing the series-connected high- and low-side switching elements S*p and S*n from being simultaneously on for respective switching cycles, i.e. turn-on cycles.

Figure 3A:
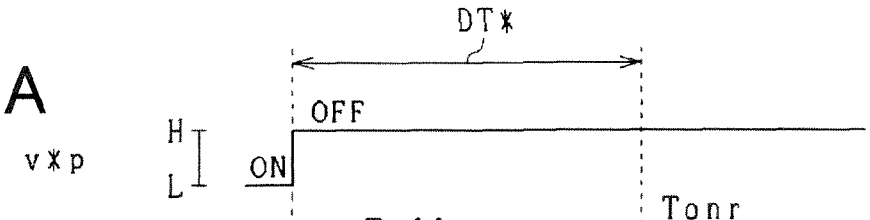
FIGS. 3A to 3C are a joint timing chart schematically illustrating a delay-time adjusting task carried out by each drive unit of the control system illustrated in FIG. 1.
Figure 3B:
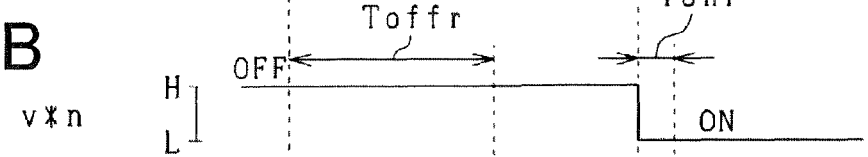
Figure 3C:
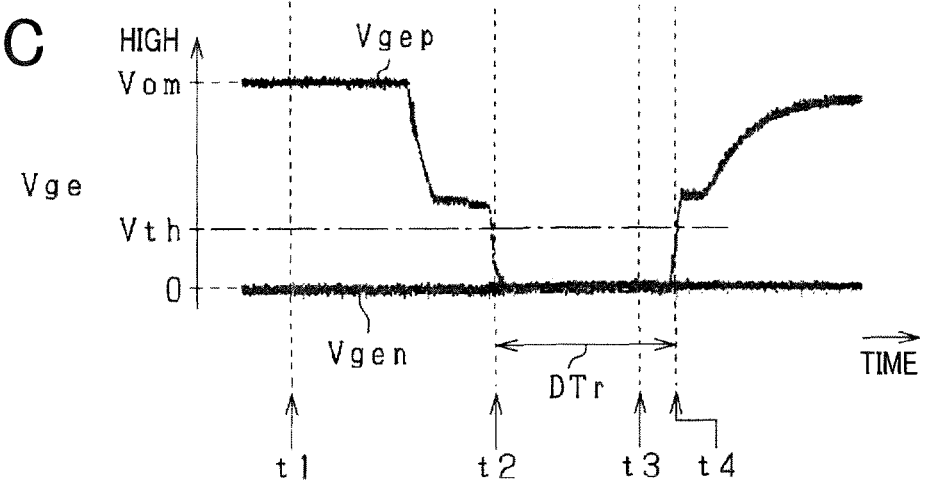

The delay-time adjusting task will be schematically described with reference to FIGS. 3A to 3C. FIG. 3A schematically illustrates how the drive signal v*p for a high-side switching element S*p of one phase input to the drive controller 34 varies over time, and FIG. 3B schematically illustrates how the drive signal v*n for a low-side switching element S*n of the same phase input to the drive controller 34 varies over time. FIG. 3C schematically illustrates how the gate voltage Vgep of the high-side switching element S*p, i.e. the gate-emitter voltage Vgep thereof, varies, and how the gate voltage Vgen of the low-side switching element S*n varies over time. Note that these variations of the drive signals v*p and v*n and the gate voltages Vgep and Vgen occur when the high-side switching element S*p is turned off, and thereafter, the low-side switching element is turned on.

As illustrated in FIG. 3A, at time t1, the drive signal v*p for the high-side switching element S*p is logically reversed from the low level to the high level. Thereafter, at time t3, the drive signal v*n for the low-side switching element S*n is logically reversed from the high level to the low level. That is, the control unit 14 is operative to determine the reversal timing of the low-side switching element S*n from the high level to the low level, thus determining a dead-time command value DT* for the low-side switching element S*n defined from the time t3 to the time t1.

Time required from the reverse time t1 of the drive signal v*p for the high-side switching element S*p from the low level to the high level to time t2 when the gate voltage Vgep of the high-side switching element S*p decreases down to a threshold voltage Vth is defined as an off delay period Toffr, which is illustrated as a time interval from the time t1 to the time t2.

In addition, time required from the reverse time t3 of the drive signal v*n for the low-side switching element S*n from the high level to the low level to time t4 when the gate voltage Vgen of the low-side switching element S*n increases up to the threshold voltage Vth is defined as an on delay period Tonr, which is illustrated as a time interval from the time t3 to the time t4.

Specifically, an actual dead time DTr between the high- and low-side switching elements S*p and S*n is defined as a time interval from the time t2 to the time t4.

The dead-time command value DT* and the actual dead time DTr has the following relation expressed by the following equation (eq1)

$$DT^* = DTr + Toffr - Tonr \qquad (eq1)$$

Based on the relation, in order to reduce variations in the dead times between the high- and low-side switching elements S*p and S*n, the drive controller 34 according to the first embodiment is configured to perform, as the delay-time adjusting task, first and second delay-time adjusting tasks that:

match the off delay period Toffr with a command value for the off delay period Toffr; and match the on delay period Tonr with a command value for the on delay period Tonr.

The command value for the off delay period Toffr is previously determined, which will be referred to as an off command value Toff*. The command value for the on delay period Tonr is previously determined, which will be referred to as an on command value Ton*.

Specifically, the variations in the off delay period Toffr of a switching element S*# and those in the on delay period Tonr thereof over switching cycles are one factor causing the variations in the actual dead time DTr over the corresponding switching cycles.

For example, variations in the off delay period Toffr and those in the on delay period Tonr of a switching element S*# over switching cycles may be based on: variations in signal transfer time through the first photocoupler 18a over the corresponding switching cycles; variations in the terminal voltage Vom of the constant voltage power source 22 over the corresponding switching cycles; variations in the resistance of each of the charging and discharging resistors 26 and 28 over the corresponding switching cycles; and/or those in signal transfer time in the drive IC 20 over the corresponding switching cycles.

In addition, variations in the off delay period Toffr and those in the on delay period Tonr of a switching element S*# over switching cycles may also be based on variations in the characteristics of the individual switching element S*# over the corresponding switching cycles including variations in the threshold voltage Vth and those in a quantity of charge stored in the gate of the switching element S*#.

Moreover, variations in the off delay period Toffr and those in the on delay period Tonr of a switching element S*# over switching cycles may further be based on how the switching element S*# has been used for the corresponding switching cycles. In other words, variations in the off delay period Toffr and those in the on delay period Tonr of a switching element S*# over switching cycles may be based on variations in the collector current Ice; variations in the temperature of the switching element S*#; and/or those in the input voltage to the inverter IV. That is, the collector current Ice, the temperature of the switching element S*#, and the input voltage to the inverter IV serve as parameters indicative of how the switching element S*# has been used for the corresponding switching cycles.

Particularly, the first and second delay-time adjusting tasks are designed to set the off delay period Toffr and the on delay period Tonr to a predetermined fixed value to thereby match the actual dead time DTr with the dead-time command value DT* determined by the control unit 14.

More particularly, assuming that the dead-time command value DT* is equal to the actual dead time DTr, the following equation (eq2) can leaded:

$$Toffr = Tonr \qquad (eq2)$$

That is, the first and second delay-time adjusting tasks are designed to commonly set the off command value Toff* and the on command value Ton* to a predetermined value to thereby match the actual dead time DTr with the dead-time command value DT* determined by the control unit 14.

Note that FIGS. 3A to 3C jointly illustrate how to adjust the off delay period Toffr and the on delay period Tonr when the high-side switching element S*p is turned off, and thereafter, the low-side switching element is turned on. When the low-side switching element S*n is turned off, and thereafter, the high-side switching element is turned on, it is possible to adjust the off delay period Toffr and the on delay period Tonr in the same approach illustrated in FIGS. 3A to 3C described above.

Specifically, if the drive controller 34 uses a conventional method for turning on a switching element S*#, the drive controller 34 is operative to:

turn on the charging switching element 24 in response to the reversal timing of the drive signal v*# therefor from the low level to the high level; and turn on the discharging switching element 30 in response to the reversal timing of the drive signal v*# therefor from the high level to the low level.

The first delay-time adjusting task carried out by the drive controller 34 of a drive unit DU for a target switching element S*# will be described hereinafter with reference to FIG. 4. Note that the drive controller 34 of each drive unit DU can be configured as a programmed logic unit, a hard-wired logic unit, or the combination of hardwired-logic and programmed-logic hybrid units, and can repeatedly carry out the first delay-time adjusting task every preset cycle as an example.

Figure 4:
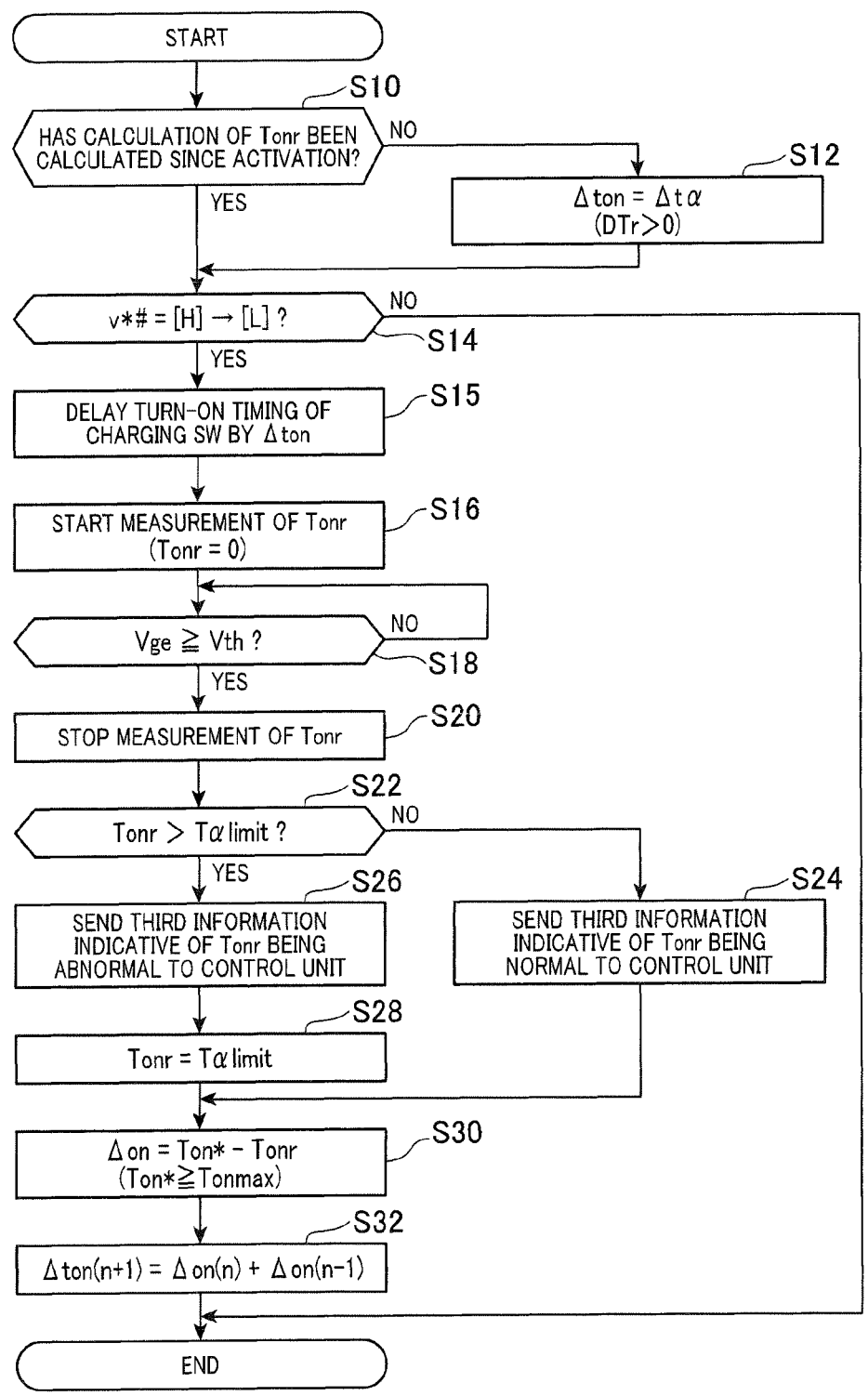
FIG. 4 is a flowchart schematically illustrating an example of a first delay-time adjusting task carried out by each drive unit of the control system illustrated in FIG. 1.

Referring to FIG. 4, when starting the first delay-time adjusting task, the drive controller 34 determines whether calculation of the on delay period Tonr has been completed since activation of the inverter IV in step S10. This operation is to determine whether calculation of a correction value required to adjust the on delay period Tonr to the on command value Ton* has been performed since activation of the inverter IV. The correction value will be referred to as an on correction value Δton, and the on correction value Δton should be set to be greater than 0. Note that activation of the inverter IV takes place when, for example, a user, i.e. a driver, of the hybrid vehicle manipulates an ignition switch (not shown) to be turned on.

Upon determination that calculation of the on delay period Tonr has not been completed since activation of the inverter IV (NO in step S10), the drive controller 34 determines that a first calculation of the on delay period Tonr has not been completed since activation of the inverter IV. Then, the drive controller 34 carries out an operation in next step S12 that sets an initial value Ata as the on correction value Δton. Specifically, in step S12, the drive controller 34 determines the initial value Ata such that the actual dead time DTr is longer than zero. This determination prevents simultaneous switching on of the target switching element S*# and the corresponding same-phase switching element, i.e. dead short-circuit, due to excessive short time to which the initial value Ata is set while the on correction value Δton is not being calculated. This prevents a short-circuit current from flowing through the target switching element S*# and the corresponding switching element of the same phase.

When the operation in step S12 is completed, or the determination in step S10 is affirmative, the drive controller 34 performs an operation in step S14 that determines whether the logical level of the drive signal v*# for the target switching element S*# is being reversed from the high level to the low level. This operation in step S14 determines whether it is time at which the drive signal v*# is being switched to the on command. This determination in step S14 is affirmative if it is time immediately after the reverse of the logical level of the drive signal v*# for the target switching element S*# from the high level to the low level.

Upon determination that the logical level of the drive signal v*# for the target switching element S*# is not being reversed from the high level to the low level (NO in step S14), the drive controller 34 terminates the first delay-time adjusting task.

Otherwise, upon determination that the logical level of the drive signal v*# for the target switching element S*# is being reversed from the high level to the low level (YES in step S14), the drive controller 34 performs the following operations in steps S15, S16, S18, and S20.

The operation in step S15 is to delay, by the previously determined on correction value Δton, the turn-on timing of the charging switching element 24 and the turn-off timing of the discharging switching element 30 from the reverse timing of the drive signal v*# from the high level to the low level. The operation in step S15 will be described in detail later The operations in steps S16, S18, and S20 measure, as the on delay period Tonr, time required for the gate voltage Vge of the target switching element S*# to have increased to reach the threshold voltage Vth since the reverse of the drive signal v*# to the low level during a corresponding current on-switching cycle for the target switching element S*#. An on-switching cycle for the target switching element S*# is defined from first time at which the drive signal v*# is reversed from the high level to the low level to second time at which the drive signal v*# is reversed again from the high level to the low level.

That is, the execution cycle of the first delay-time adjusting task is set to be shorter than the on-switching cycle for the switching element S*#. As a result, the drive controller 34 carries out the operations in steps S16 to S32 or steps S16 to S22, S24, S30, and S32 every on-switching cycle.

FIGS. 5A to 5D jointly illustrate how to measure the on delay period Tonr. Specifically, FIG. 5A schematically illustrates how the drive signal v*# varies over time, and FIG. 5B schematically illustrates how a voltage Va at a point in a path defined between the charging switching element 24 and the charging resistor 26 varies over time. FIG. 5C schematically illustrates how the gate voltage Vge of the target switching element S*# varies over time, and FIG. 5D schematically illustrates how the collector current Ice flowing through the target switching element S*# varies over time.

Referring to FIGS. 4 and 5, in step S16, the drive controller 34 starts measuring, i.e. counting, a value as the on delay period Tonr from its initial value of zero from time t11 at which the affirmative determination occurs in step S14. At the time t11, the charging switching element 24 is turned on, and the discharging switching element 30 is turned off. This causes the gate voltage Vge of the target switching element S*# to increase from time t11a after the time t11. Note that the delay from the time t11 to the time t11a is due to, for example, signal-transfer delay in the drive IC 20.

Next, the drive controller 34 determines whether the gate voltage Vge of the target switching element S*# becomes equal to or higher than the threshold voltage Vth in step S18. Upon determination that the gate voltage Vge of the target switching element S*# is lower than the threshold voltage Vth (NO in step S18), the drive controller 34 continues the measuring operation. Otherwise, upon determination that the gate voltage Vge of the target switching element S*# becomes equal to or higher than the threshold voltage Vth (YES in step S18, see time t12), the drive controller 34 stops the measuring operation, and determines the current counted value as the on delay period Tonr in step S20 (see the period from the time t11 to the time t12).

Note that, during design time, the threshold voltage Vth of each switching element S*# can be set within a predetermined voltage range from a lower limit to an upper limit. In the first embodiment, in view of preventing dead short-circuit, a value of the threshold voltage Vth of each switching element S*# is preferably set to the lower limit of a corresponding voltage range. This reliably prevents the target switching element and a corresponding same-phase switching element from being simultaneously on.

Returning to FIG. 4, following the operation in step S20, the drive controller 34 determines whether the counted on delay period Tonr has exceeded its upper limit $T_{\alpha limit}$ previously defined in step S22. This operation is to prevent the on delay period Tonr from being erroneously counted as an excessive long time due to any reason, thus prohibiting the actual dead time DTr from being excessively long. This makes it possible to prevent the occurrence of dead short-circuit between the target switching element S*# and the corresponding switching element of the same phase.

Upon determination that the counted on delay period Tonr has not exceeded its upper limit $T_{\alpha limit}$ (NO in step S22), the drive controller 34 determines that the counted on delay period Tonr is normal. Then, the drive controller 34 transfers the counted on delay period Tonr to the control unit 14 in step S24.

Figure 6:
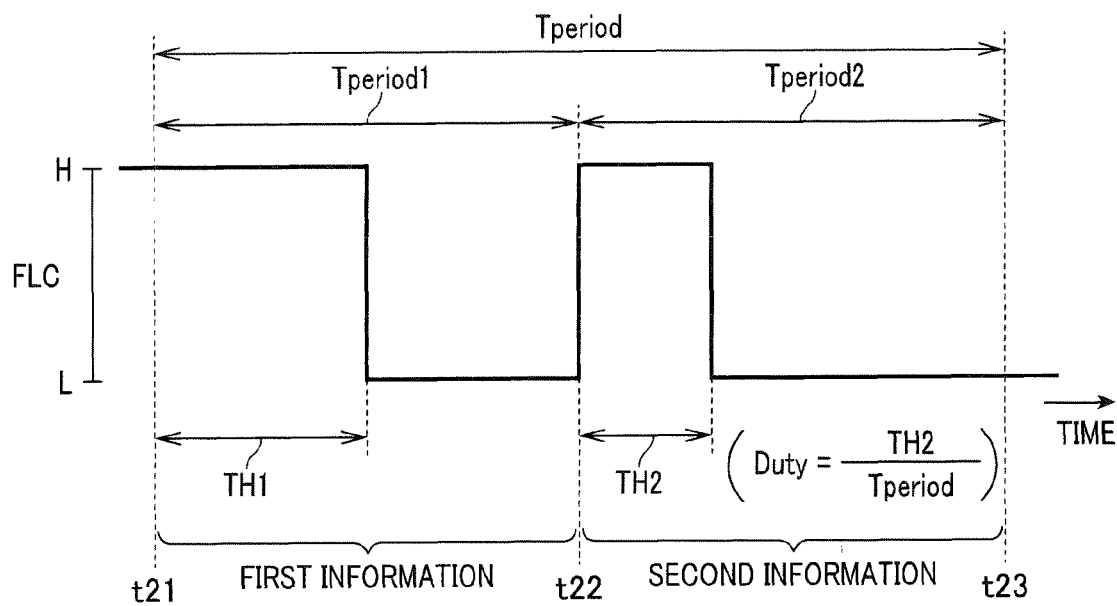
FIG. 6 is a view schematically illustrating first information and second information sent from the each drive unit to a control unit illustrated in FIG. 2 according to the first embodiment.

Specifically, in the first embodiment, as illustrated in FIG. 6, the drive controller 34 sends, for each given period $T_{period}$, first information indicative of the counted on delay period Tonr being normal and second information indicative of the counted on delay period Tonr to the control unit 14 via the second photocoupler 18b.

For example, the drive controller 34 according to the first embodiment is configured to modulate the fail-safe command FLC during a first half $T_{period1}$ of each period $T_{period}$ to determine a first duty, i.e. a first percentage, of the high-level duration to the total first half period $T_{period1}$ such that the first duty shows that the counted on delay period Tonr is normal. Following the first half period $T_{period1}$, the drive controller 34 is configured to modulate the fail-safe command FLC during a second half period $T_{period2}$ of each period $T_{period}$ to determine a second duty, i.e. a second percentage, of the high-level duration to the total second half period $T_{period2}$ such that the second duty shows the counted on delay period Tonr.

Specifically, as illustrated in FIG. 6, when the operation in step S24 is completed, the drive controller 34 modulates, during a first half period $T_{period1}$ from time t21 to time t22 of a period $T_{period}$, the fail-safe command FLC, thus determining the first duty of the high-level duration TH1 to the total first half period $T_{period1}$ to 50%; the 50% of the duty shows that the counted on delay period Tonr is normal.

Figure 7:
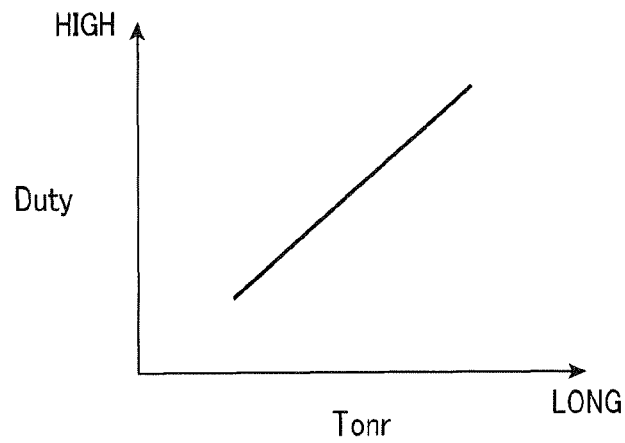
FIG. 7 is a graph schematically illustrating information indicative of the correlation between a variable of a duty and a variable of the on delay time according to the first embodiment.

Successively, the drive controller 34 modulates, during a second half period $T_{period2}$ from the time t22 and time t23, the fail-safe command FLC, thus determining the second duty of the high-level duration TH2 to the total second half period $T_{period2}$ to a predetermined percent showing the counted on delay period Tonr. For example, as illustrated in FIG. 7, the drive controller 34 has a map including information indicative of the correlation between the variable of the duty and the variable of the on delay period Tonr. Referring to FIG. 7, the duty and the on delay period Tonr have a proportional relationship therebetween. That is, based on the map, the drive controller 34 determines a value of the second duty of the high-level duration TH2 to the total second half period $T_{period2}$; the value matches with the counted on delay period Tonr.

Returning to FIG. 4, otherwise, upon determination that the counted on delay period Tonr has exceeded its upper limit $T_{\alpha limit}$ (YES in step S22), the drive controller 34 determines that the measured on delay period Tonr is abnormal because it is an excessively long value. Then, the drive controller 34 sends third information indicative of the counted on delay period Tonr being abnormal and fourth information indicative of the counted on delay period Tonr to the control unit 14 via the second photocoupler 18b in step S26.

The method for sending the third information and the fourth information in step S26 is substantially identical to the method for sending the first information and the second information in step S24 except that a value of the duty showing that the counted on delay period Tonr is abnormal is set to be different from a value of the duty showing that the counted on delay period Tonr is normal.

Following the operation in step S26, the drive controller 34 sets the on delay period Tonr as the upper limit $T_{\alpha limit}$ in step S28.

When the operation in step S24 or the operation in step S28 is completed, the drive controller 34 carries out an operation in the following step S30 that subtracts the on delay period Tonr from the on command value Ton*, thus calculating an on deviation Δon.

The on command value Ton* is previously determined to be equal to or higher than a maximum value Tonmax for the on delay period Tonr. That is, the on delay period Tonr could take the maximum value Tonmax if the on delay period Tonr was not adjusted. This is based on the fact that the on delay period Tonr cannot be adjusted to be reduced.

Note that, as described above, the drive controller 34 carries out the operations in step S16 and the following steps every on-switching cycle. At that time, a current execution cycle of the on delay-time adjusting task corresponds to a current on-switching cycle will be referred to as an n-th execution cycle of the first delay-time adjusting task corresponds to an n-th on-switching cycle. Hereinafter, the on deviation Δon calculated in the n-th execution cycle of the first delay-time adjusting task will be referred to as an on deviation Δon(n), and the on deviation Δon calculated in the (n−1)-th execution cycle of the first delay-time adjusting task will be referred to as an on deviation Δon(n−1). If the n-th execution cycle of the first delay-time adjusting task is the first execution cycle of the first delay-time adjusting task, i.e. n=1, a preset initial value is used as the on deviation Δon (n−1).

Following the operation in step S30, the drive controller 34 calculates the sum of the on deviation Δon(n) calculated in step S30 of the n-th on-switching cycle and the on deviation Δon(n−1) calculated in step S30 of the (n−1)-th on-switching cycle. This calculates an on correction value Δton(n+1) for the (n+1)-th execution cycle of the first delay-time adjusting task corresponding to the (n+1)-th on-switching cycle in step S32.

Thus, in step S15 of the (n+1)-th execution cycle of the first delay-time adjusting task, the turn-on timing of the charging switching element 24 and the turn-off timing of the discharging switching element 30 are delayed by the on correction value Δton(n+1) from the reverse timing of the drive signal v*# from the high level to the low level. This makes it possible to match the on delay period Tonr with the on command value Ton* for the (n+1)-th on switching cycle.

When the operation in step S32 is completed, the drive controller 34 terminates the first delay-time adjusting task.

Next, the second delay-time adjusting task carried out by the drive controller 34 of a drive unit DU for a target switching element S*# will be described hereinafter with reference to FIG. 8. Note that the drive controller 34 of each drive unit DU can repeatedly carry out the second delay-time adjusting task every preset cycle as an example.

Figure 8:
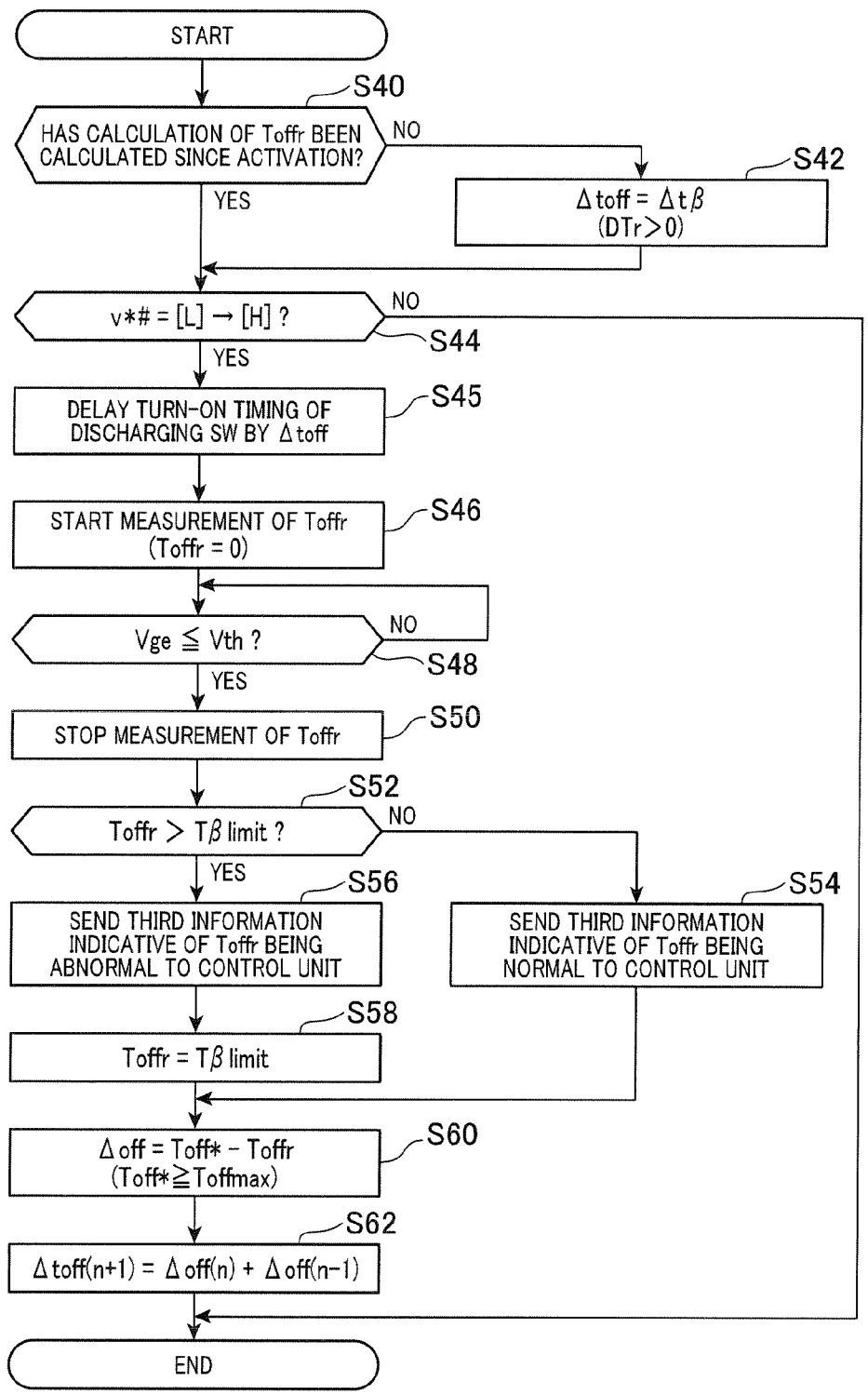
FIG. 8 is a flowchart schematically illustrating an example of a second delay-time adjusting task carried out by each drive unit of the control system illustrated in FIG. 1.

Referring to FIG. 8, when starting the second delay-time adjusting task, the drive controller 34 determines whether calculation of the off delay period Toffr has been completed since activation of the inverter IV in step S40. This operation is to determine whether calculation of a correction value required to adjust the off delay period Toffr to the off command value Toff* has been performed since activation of the inverter IV. The correction value will be referred to as an off correction value Δtoff, and the off correction value Δtoff should be set to be greater than 0.

Upon determination that calculation of the off delay period Toffr has not been completed since activation of the inverter IV (NO in step S40), the drive controller 34 determines that a first calculation of the off delay period Toffr has not been completed since activation of the inverter IV. Then, the drive controller 34 carries out an operation in next step S42 that sets an initial value Δtβ as the off correction value Δtoff. Specifically, in step S42, the drive controller 34 determines the initial value Δtβ such that the actual dead time DTr is longer than zero like the operation in step S12. This determination prevents simultaneous switching on of the target switching element S*# and the corresponding same-phase switching element, i.e. dead short-circuit, due to excessive long time to which the initial value Δtβ is set during no calculation of the off correction value Δtoff. This prevents a short-circuit current from flowing through the target switching element S*# and the corresponding switching element of the same phase.

When the operation in step S42 is completed, or the determination in step S40 is affirmative, the drive controller 34 performs an operation in step S44 that determines whether the logical level of the drive signal v*# for the target switching element S*# is being reversed from the low level to the high level. This operation in step S44 determines whether it is time at which the drive signal v*# is being switched to the off command. This determination in step S44 is affirmative if it is time immediately after the reverse of the logical level of the drive signal v*# for the target switching element S*# from the low level to the high level.

Upon determination that the logical level of the drive signal v*# for the target switching element S*# is not being reversed from the low level to the high level (NO in step S44), the drive controller 34 terminates the second delay-time adjusting task.

Otherwise, upon determination that the logical level of the drive signal v*# for the target switching element S*# is being reversed from the low level to the high level (YES in step S44), the drive controller 34 performs the following operations in steps S45, S46, S48, and S50.

The operation in step S45 is to delay, by the previously determined on correction value Δtoff, the turn-on timing of the discharging switching element 30 and the turn-on timing of the charging switching element 24 from the reverse timing of the drive signal v*# from the low level to the high level. The operation in step S45 will be described in detail later The operations in steps S46, S48, and S50 measure, as the off delay period Toffr, time required for the gate voltage Vge of the target switching element S*# to have decreased to reach the threshold voltage Vth since the reverse of the drive signal v*# to the high level during a corresponding current off-switching cycle for the target switching element S*#. An off-switching cycle for the target switching element S*# is defined from first time at which the drive signal v*# is reversed from the low level to the high level to second time at which the drive signal v*# is reversed again from the low level to the high level.

That is, the execution cycle of the second delay-time adjusting task is set to be shorter than the off-switching cycle for the switching element S*#. As a result, the drive controller 34 carries out the operations in steps S46 to S62 or steps S46 to S52, S54, S60, and S62 every off-switching cycle.

Specifically, in step S46, the drive controller 34 starts measuring, i.e. counting, a value as the off delay period Toffr from its initial value of zero from the time at which the affirmative determination occurs in step S44. Next, the drive controller 34 determines whether the gate voltage Vge of the target switching element S*# becomes equal to or lower than the threshold voltage Vth in step S48. Upon determination that the gate voltage Vge of the target switching element S*# is higher than the threshold voltage Vth (NO in step S48), the drive controller 34 continues the measuring operation. Otherwise, upon determination that the gate voltage Vge of the target switching element S*# becomes equal to or lower than the threshold voltage Vth (YES in step S48), the drive controller 34 stops the measuring operation, and deter lines the current counted value as the off delay period Toffr in step S50.

Following the operation in step S50, the drive controller 34 determines whether the counted off delay period Toffr has exceeded its upper limit $T_{\beta limit}$ previously defined in step S52. This operation is to prevent the off delay period Toffr from being erroneously counted as an excessive long time due to any reason, thus prohibiting the actual dead time DTr from being excessively long. This makes it possible to prevent the occurrence of dead short-circuit between the target switching element S*# and the corresponding switching element of the same phase.

Upon determination that the counted off delay period Toffr has not exceeded its upper limit $T_{\beta limit}$ (NO in step S52), the drive controller 34 determines that the counted off delay period Toffr is normal. Then, the drive controller 34 sends first information indicative of the counted off delay period Toffr being normal and second information indicative of the counted off delay period Toffr to the control unit 14 via the second photocoupler 18b in step S54 in the same approach as the approach described in step S24.

Otherwise, upon determination that the counted off delay period Toffr has exceeded its upper limit $T_{\beta limit}$ (YES in step S52), the drive controller 34 determines that the counted off delay period Toffr is abnormal because it is an excessively long value. Then, the drive controller 34 sends third information indicative of the counted off delay period Toffr being abnormal and fourth information indicative of the counted off delay period Toffr to the control unit 14 via the second photocoupler 18b in step S56 in the same approach described in step S26.

Following the operation in step S56, the drive controller 34 sets the off delay period Toffr as the upper limit $T_{\beta limit}$ in step S58.

When the operation in step S54 or the operation in step S58 is completed, the drive controller 34 carries out an operation in the following step S60 that subtracts the off delay period Toffr from the off command value Toff*, thus calculating an off deviation Δoff.

The off command value Toff* is previously determined to be equal to or higher than a maximum value Toffmax for the off delay period Toffr. That is, the off delay period Toffr could take the maximum value Toffmax if the off delay period Toffr was not adjusted. This is based on the fact that the off delay period Toffr cannot be adjusted to be reduced.

Note that, as described above, the drive controller 34 carries out the operations in steps S46 and the following steps every off-switching cycle. At that time, a current execution cycle of the off delay-time adjusting task corresponds to a current off-switching cycle will be referred to as an n-th execution cycle of the second delay-time adjusting task corresponds to an n-th off-switching cycle. Hereinafter, the off deviation Δoff calculated in the n-th execution cycle of the second delay-time adjusting task will be referred to as an off deviation Δoff(n), and the off deviation Δoff calculated in the (n−1)-th execution cycle of the second delay-time adjusting task will be referred to as an off deviation Δoff(n−1). If the n-th execution cycle of the second delay-time adjusting task is the first execution cycle of the second delay-time adjusting task, i.e. n=1, a preset initial value is used as the off deviation Δoff(n−1).

Following the operation in step S60, the drive controller 34 calculates the sum of the off deviation Δoff(n) calculated in step S60 of the n-th off-switching cycle and the off deviation Δoff(n−1) calculated in step S60 of the (n−1)-th off-switching cycle. This calculates an off correction value Δtoff(n+1) for the (n+1)-th execution cycle of the second delay-time adjusting task corresponding to the (n+1)-th off-switching cycle in step S62.

Thus, in step S45 of the (n+1)-th execution cycle of the second delay-time adjusting task, the turn-on timing of the discharging switching element 30 and the turn-off timing of the charging switching element 24 are delayed by the off correction value Δtoff(n+1) from the reverse timing of the drive signal v*# from the low level to the high level. This makes it possible to match the off delay period Toffr with the off command value Toff* for the (n+1)-th off switching cycle.

When the operation in step S62 is completed, the drive controller 34 terminates the second delay-time adjusting task.

Figure 9:
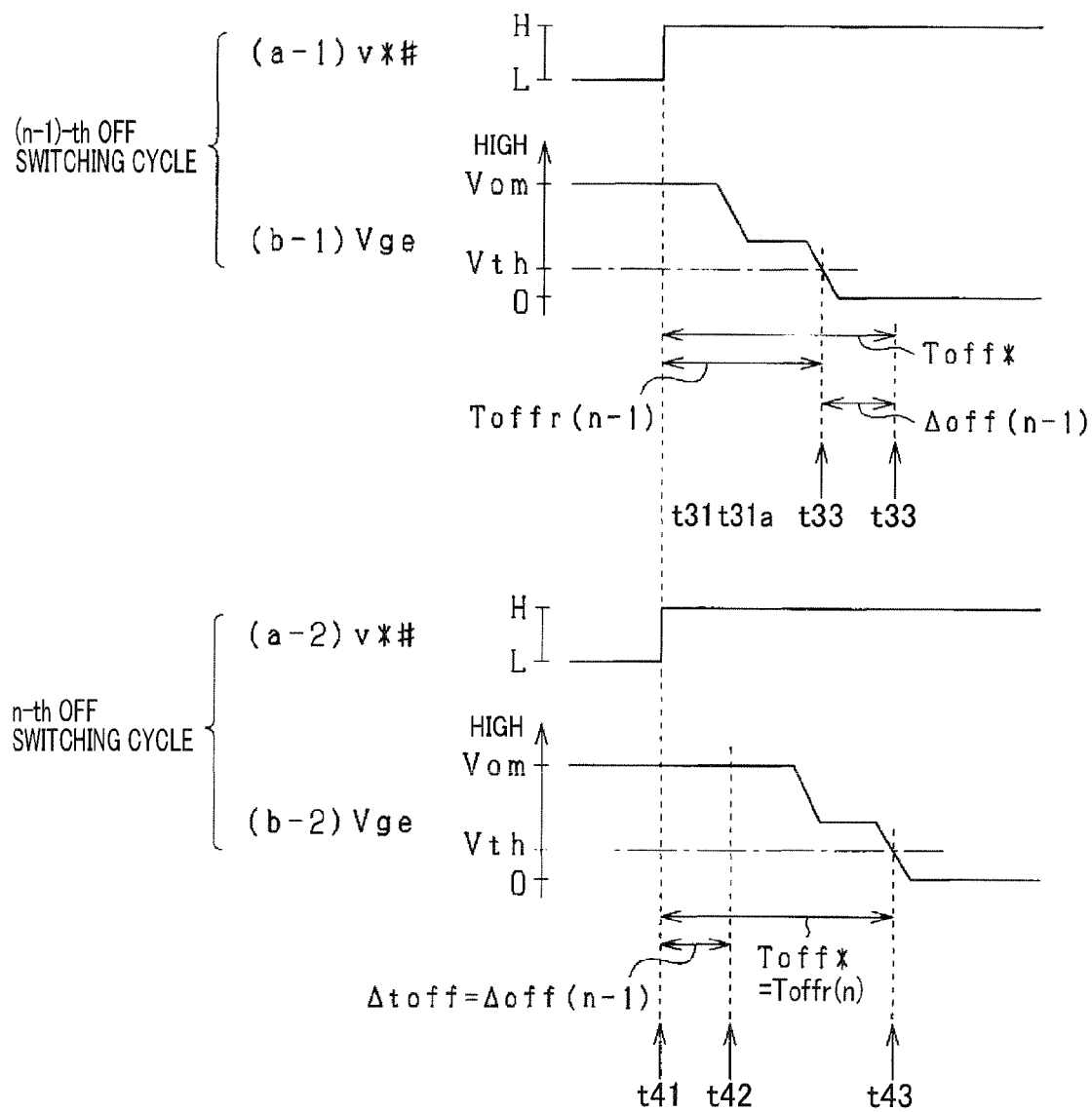
FIG. 9 is a timing chart schematically illustrating an example of specific operations of a drive controller of a drive unit for a target switching element based on the second delay-time adjusting task.

FIG. 9 schematically illustrates an example of specific operations of the drive controller 34 of a drive unit DU for a target switching element S*# based on the second delay-time adjusting task.

Specifically, reference character (a-1) of FIG. 9 schematically illustrates how the drive signal v*# varies over time in an (n−1)-th off switching cycle for the target switching element S*#. Reference character (b-1) of FIG. 9 schematically illustrates how the gate voltage Vge of the target switching element S*#" varies over time in the (n−1)-th off switching cycle.

In addition, reference character (a-2) of FIG. 9 schematically illustrates how the drive signal v*# varies over time in an n-th off switching cycle for the target switching element S*#. Reference character (b-2) of FIG. 9 schematically illustrates how the gate voltage Vge of the target switching element S*#" varies over time in the n-th off switching cycle.

Referring to FIG. 9, when the drive signal v*# is logically reversed from the low level to the high level at time t31 (see YES in step S44), measurement of the off delay period Toffr (n−1) in the (n−1)-th off switching cycle is started (see steps S44 and S46). At the time t31, the discharging switching element 30 is turned on, and the charging switching element 24 is turned off. This causes the gate voltage Vge of the target switching element S*# to decrease from time t31a after the time t31.

Thereafter, when the gate voltage Vge decreases to be equal to or lower than the threshold voltage at time t32, the measurement is stopped, and a current counted value defined from the time t32 to the time t31 is calculated as the off delay period Toffr(n−1) in the (n−1)-th off switching cycle (see the operations in steps S48 and S50).

As illustrated in FIG. 9, assuming that the off command value Toff* is set as the time interval from the time t31 to time t33 greater than the time t32, subtraction of the calculated off delay period Toffr(n−1) from the off command value Toff* calculates an off deviation Δoff(n−1) (see the operation in step S60). In FIG. 9, it is also assumed that an off deviation Δoff(n−2) calculated in step S60 of the (n−2)-th switching cycle is set to zero. In this assumption, as the off correction value Δtoff for the n-th off switching cycle, the off deviation Δoff(n−1) is calculated (see step S62) because the sum of the off deviation Δoff(n−1) and the off deviation Δoff(n−2) is the off deviation Δoff(n−1).

Thereafter, when the drive signal v*# is logically reversed again from the low level to the high level at time t41 after lapse of the (n−1)-th off switching cycle (see YES in step S44). At that time, as the off correction value Δtoff for the n-th off switching cycle, the off deviation Δoff(n−1) has been calculated for the n-th off switching cycle. Thus, the turn-on timing of the discharging switching element 30 and the turn-off timing of the charging switching element 24 are delayed by the off correction value Δtoff(n) equal to the off deviation Δoff(n−1) from the reverse timing t41 of the drive signal v*# from the low level to the high level (see step S45). Thus, after the lapse of the off correction value Δtoff(n) equal to the off deviation Δoff(n−1) from the reverse timing t41, the discharging switching element 30 is turned on and the charging switching element 24 is turned off at time t42. This results in the off delay period Toffr (n) defined from the time t41 to time t43 being matched with the off command value Toff* as illustrated in FIG. 9.

Next, a diagnosing task for delay-time adjustment, which is carried out by the control unit 14, will be described hereinafter with reference to FIG. 10. Note that the control unit 14 can repeatedly carry out the diagnosing task every preset cycle as an example.

Figure 10:
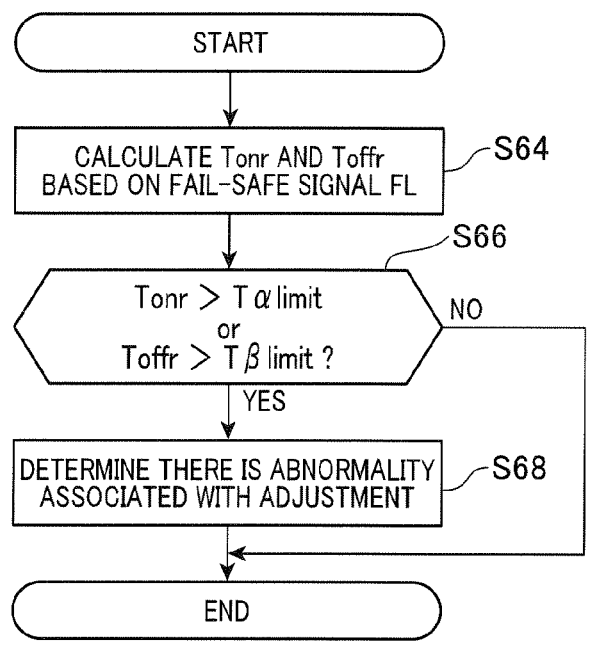
FIG. 10 is a flowchart schematically illustrating a diagnosing task carried out by the control unit according to the first embodiment.

Referring to FIG. 10, based on the fail-safe signal FL output from each drive unit DU via the second photocoupler 18b for every period $T_{period}$, the control unit 14 extracts the second duty for the on delay period Tonr from the fail-safe signal FL, and extracts the second duty for the off delay period Toffr in step S64. Then, in step S64, the control unit 14 calculates the on delay period Tonr based on the second duty for the on delay period Tonr, and the off delay period Toffr based on the second duty for the off delay period Toffr.

Then, the control unit 14 determines whether at least one of: a first condition representing that the on delay period Tonr calculated in step S64 is higher than the upper limit $T_{\alpha limit}$ therefor; and a second condition representing that the off delay period Toffr calculated in step S64 is higher than the upper limit $T_{\beta limit}$ is met in step S66.

Upon determination that at least one of the first condition and the second condition is met (YES in step S66), the control unit 14 carries out an operation in step S68 that determines that there is an abnormality associated with adjustment of a corresponding at least one of the on delay period Tonr and the off delay period Toffr. In step S68, if the control unit 14 is communicably connected to an external device, such as a host control unit, the control unit 14 can transfer, to the external device, information representing that there is an abnormality associated with adjustment of a corresponding at least one of the on delay period Tonr and the off delay period Toffr. After the operation in step S68 is completed, the control unit 14 terminates the diagnosing task.

Otherwise, upon determination that no first condition and second condition are met (NO in step S66), the control unit 14 determines that there are no abnormalities associated with adjustment of the on delay period Tonr and the off delay period Toffr, thus terminating the diagnosing task.

Note that the control unit 14 can be configured to determine whether there is an abnormal associated with adjustment of at least one of the on delay period Tonr and the off delay period Toffr based on the first duty for the on delay period Tonr and the second duty for the off delay period Toffr included in the fail-safe signal FL (see step S22, S26, S52, and S56).

As described above, the drive unit DU provided for each switching element S*# according to the first embodiment is configured to:

measure, as the on delay period Tonr, time required for the gate voltage Vge of the target switching element S*# to have increased to reach the threshold voltage Vth since the reverse of the drive signal v*# to the low level during each current on-switching cycle;

adjust the on delay period Tonr for the next on-switching cycle based on the measured on delay period Tonr such that the adjusted on delay period Tonr for the next on-switching cycle matches with an on command value Ton* for the on delay period Tonr;

measure, as the off delay period Toffr, time required for the gate voltage Vge of the target switching element S*# to have decreased to reach the threshold voltage Vth since the reverse of the drive signal v*# to the high level during each current off-switching cycle; and adjust the off delay period Toffr for the next off-switching cycle based on the measured off delay period Toffr such that the adjusted off delay period Toffr for the next off-switching cycle matches with an off command value Toff* for the off delay period Toffr.

This configuration:

determines turn-on required time to a given value for each on-switching cycle after the first measurement of the on delay period Tonr, the turn-on required time being taken, from the input of the drive signal v*# to the drive IC 20 of a corresponding drive unit DU, to actual turn-on of a corresponding switching element S*#; and determines turn-off required time to a given value for each off-switching cycle after the first measurement of the off delay period Toffr, the turn-off required time being taken, from the input of the drive signal v*# to the drive IC 20 of a corresponding drive unit DU, to actual turn-off of a corresponding switching element S*#.

For example, this configuration determines, to a common constant value, the turn-on required time for each on-switching cycle after the first measurement of the on delay period Tonr and the turn-off required time for each off-switching cycle after the first measurement of the off delay period. This sets, to a constant value, actual dead time DTr between series-connected switching elements S*p and S*n for each on-off switching cycle. On-off switching cycle of series-connected switching elements S*p and S*n shows a cycle of any one of the series-connected switching elements S*p and S*n being turned on. This results in reduction of variations in the actual dead time DTr for each on-off switching cycle, thus increasing the controllability of the inverter IV.

As another example, this configuration adjusts the turn-on required time for each on-switching cycle after the first measurement of the on delay period Tonr and the turn-off required time for each off-switching cycle after the first measurement of the off delay period such that actual dead time DTr between series-connected switching elements S*p and S*n for each on-off switching cycle approaches zero. This increases power conversion efficiency of the inverter IV in addition to the increase in the controllability of the inverter IV.

Thus, in contrast to the technology disclosed in the Patent Publication No. 2010-142074, it is possible to reduce the number of parameters required to reduce variations in actual dead time DTr between series-connected switching elements S*p and S*n for each on-off switching cycle. This results in the circuit structure of the drive unit DU provided for each switching element S*# required to reduce variations in actual dead time DTr between series-connected switching elements S*p and S*n for each on-off switching cycle being more simpler than the circuit structure disclosed in the Patent Publication No. 2010-142074.

This configuration of the drive unit DU provided for each switching element S*# set forth above is also capable of completely adjusting the on delay period Tonr and the off delay period Toffr within the high voltage system. In comparison to a system for adjusting the on delay period Tonr and the off delay period Toffr within the low voltage system, it is possible to eliminate the need for additional means, such as photocouplers, for transferring the gate voltage Vge of each switching element S*# from the high voltage system to the low voltage system while establishing electrical insulation between the high and low voltage systems.

The drive unit DU provided for each switching element S*# according to the first embodiment is specially configured to:

measure the on delay period Tonr of each switching element for each on-switching cycle;

adjust the on delay period Tonr for a current on-switching cycle based on the on delay period Tonr measured for the previous on-switching cycle;

measure the off delay period Toffr of each switching element for each off-switching cycle; and adjust the off delay period Toffr for a current off-switching cycle based on the off delay period Toffr measured for the previous off-switching cycle.

As described above, the off delay period Toffr and the on delay period Tonr of switching elements S*# may vary depending on how the switching elements S*# are used and depending on the variations in the characteristics of the individual switching elements S*#. In view of the circumstances, the configuration of the drive unit DU provided for each switching element S*# adjusts the on delay period Tonr and the off delay period Toffr of a corresponding switching element S*# for each on- and off-switching cycles based on the on delay period Tonr and the off delay period Toffr actually measured for the previous on- and off switching cycles. Thus, it is possible to adjust the on delay period Tonr and off delay period Toffr of each switching element S*# to be matched with their on and off command values Ton* and Toff* even if the off delay period Toffr and on delay period Tonr of the switching elements S*# may vary depending on how the switching elements S*# are used and depending on the variations in the characteristics of the individual switching elements S*#.

The drive unit DU provided for each switching element S*# according to the first embodiment is specially configured to:

set an initial value $\Delta t\alpha$ as the on correction value $\Delta ton$ when calculation of the on delay period Tonr has not been completed since activation of the inverter IV; and set an initial value $\Delta t\alpha$ as the off correction value $\Delta toff$ when calculation of the off delay period Toffr has not been completed since activation of the inverter IV.

This configuration prevents dead short-circuit between series-connected switching elements for a first measurement and adjustment of each of the on delay period Tonr and the off delay period Toffr. This makes it possible to maintain, at a high level, the reliability of each switching element S*#.

The drive unit DU provided for each switching element S*# according to the first embodiment is specially configured to:

limit the counted on delay period Tonr to its upper limit $T_{\alpha limit}$ when the counted on delay period Tonr has exceeded its upper limit $T_{\alpha limit}$; and limit the counted off delay period Toffr to its upper limit $T_{\beta limit}$ when the counted off delay period Toffr has exceeded its upper limit $T_{\beta limit}$.

This configuration would prevent the reduction in the controllability of the motor-generator 10 and/or the occurrence of dead short-circuit between series-connected switching elements due to excessively long dead time.

The drive unit DU provided for each switching element S*# according to the first embodiment is specially configured to send information indicative of the adjusted on delay period Tonr and the adjusted off delay period Toffr to the control unit 14 via the second photocoupler 18b. This configuration permits the control unit 14 to diagnose whether there is an abnormality associated with adjustment of at least one of the on delay period Tonr and the off delay period Toffr based on the information.

This configuration permits the control unit 14 to easily know whether adjustment of the on delay period Tonr and the off delay period Toffr is accurately performed.

Particularly, the drive unit DU provided for each switching element S*# according to the first embodiment is configured to modulate the fail-safe command FLC to include information indicative of the adjusted on delay period Tonr and the adjusted off delay period Toffr, and send the fail-safe command FLC through the second coupler 18b to the control unit 14 as the fail-safe signal FL.

This configuration eliminates the need for additional means, such as photocouplers, for transferring information indicative of the adjusted on delay period Tonr and the adjusted off delay period Toffr to the control unit 14.

Second Embodiment

A control system for controlling the motor-generator 10 according to a second embodiment of the present disclosure will be described with reference to FIGS. 11 and 12.

The structure and/or functions of the control system according to the second embodiment are mainly identical to those of the control system 100 according to the first embodiment except for the following points. So, the different points will be mainly described hereinafter.

The drive unit DU provided for each switching element S*# according to the second embodiment is configured to measure each of the on delay period Tonr and the off delay period Toffr for a corresponding one of on-switching cycle and an off-switching cycle using the sense voltage Vse in place of the gate voltage Vge. This configuration uses the fact that the sense voltage Vse correlates with the collector current Ice.

FIGS. 11A to 11E jointly illustrate how to measure the on delay period Tonr. FIGS. 11A to 11D correspond to respective FIGS. 5A to 5D, and FIG. 11E schematically illustrates how the sense voltage Vse varies over time.

Referring to FIGS. 4 and 11, in step S16, the drive controller 34 starts measuring, i.e. counting, a value as the on delay period Tonr from its initial value of zero from time t51 at which the affirmative determination occurs in step S14. At the time t51, the charging switching element 24 is turned on, and the discharging switching element 30 is turned off. This causes the gate voltage Vge of the target switching element S*# to increase from time t51a after the time t51. When the gate voltage Vge reaches the threshold voltage Vth, the collector current Ice starts to increase, and therefore, the sense voltage Vse starts to increase at time t51b.

Next, the drive controller 34 determines whether the sense voltage Vse in place of the gate voltage Vge becomes equal to or higher than a first threshold voltage level Va higher than zero in step S18 in which the gate voltage Vge is replaced with the sense voltage Vse.

Upon determination that the sense voltage Vse of the target switching element S*# is lower than the first reference voltage level Va (NO in step S18), the drive controller 34 continues the measuring operation. Otherwise, upon determination that the sense voltage Vse of the target switching element S*# is equal to or higher than the first reference voltage level Va (YES in step S18, see time t52), the drive controller 34 stops the measuring operation, and determines the current counted value as the on delay period Tonr in step S20 (see the period from the time t51 to the time t52).

Other operations of the first delay-time adjusting task according to the second embodiment are identical to those of the first delay-time adjusting task according to the first embodiment.

In addition, FIGS. 12A to 12E jointly illustrate how to measure the off delay period Toffr. FIGS. 12A to 12E correspond to respective FIGS. 11A to 11E.

Referring to FIGS. 8 and 12, in step S46, the drive controller 34 starts measuring, i.e. counting, a value as the off delay period Toffr from its initial value of zero from time t61 at which the affirmative determination occurs in step S44. At the time t61, the discharging switching element 30 is turned on, and the charging switching element 24 is turned off. This causes the gate voltage Vge of the target switching element S*# to decrease from time t61. When the gate voltage Vge reaches the threshold voltage Vth, the collector current Ice starts to decrease, and therefore, the sense voltage Vse, which has been rapidly rising as a spike, starts to decrease at time t61a.

Next, the drive controller 34 determines whether the sense voltage Vse in place of the gate voltage Vge becomes equal to or lower than a second threshold voltage level vβ higher than zero in step S48 in which the gate voltage Vge is replaced with the sense voltage Vse.

Upon determination that the sense voltage Vse of the target switching element S*# is higher than the second reference voltage level Vβ (NO in step S48), the drive controller 34 continues the measuring operation. Otherwise, upon determination that the sense voltage Vse of the target switching element S*# is equal to or lower than the second reference voltage level Vβ (YES in step S48, see time t62), the drive controller 34 stops the measuring operation, and determines the current counted value as the off delay period Toffr in step S50 (see the period from the time t61 to the time t62).

Other operations of the second delay-time adjusting task according to the second embodiment are identical to those of the second delay-time adjusting task according to the first embodiment.

The first reference voltage level Vα can be set to be equal to or different from the second reference voltage level Vβ.

Other structures and functions of the control system according to the second embodiment are identical to those of the control system 100 according to the first embodiment.

The drive unit DU provided for each switching element S*# according to the second embodiment is substantially identical to that provided therefor according to the first embodiment except for only the method of measuring each of the on delay period Tonr and the off delay period Toffr. For this reason, the control system according to the second embodiment achieves the same technical effects as those achieved by the control system 100 according to the first embodiment.

Third Embodiment

A control system for controlling the motor-generator 10 according to a third embodiment of the present disclosure will be described with reference to FIG. 13.

The structure and/or functions of the control system according to the third embodiment are mainly identical to those of the control system 100 according to the first embodiment except for the following points. So, the different points will be mainly described hereinafter.

Figure 13:
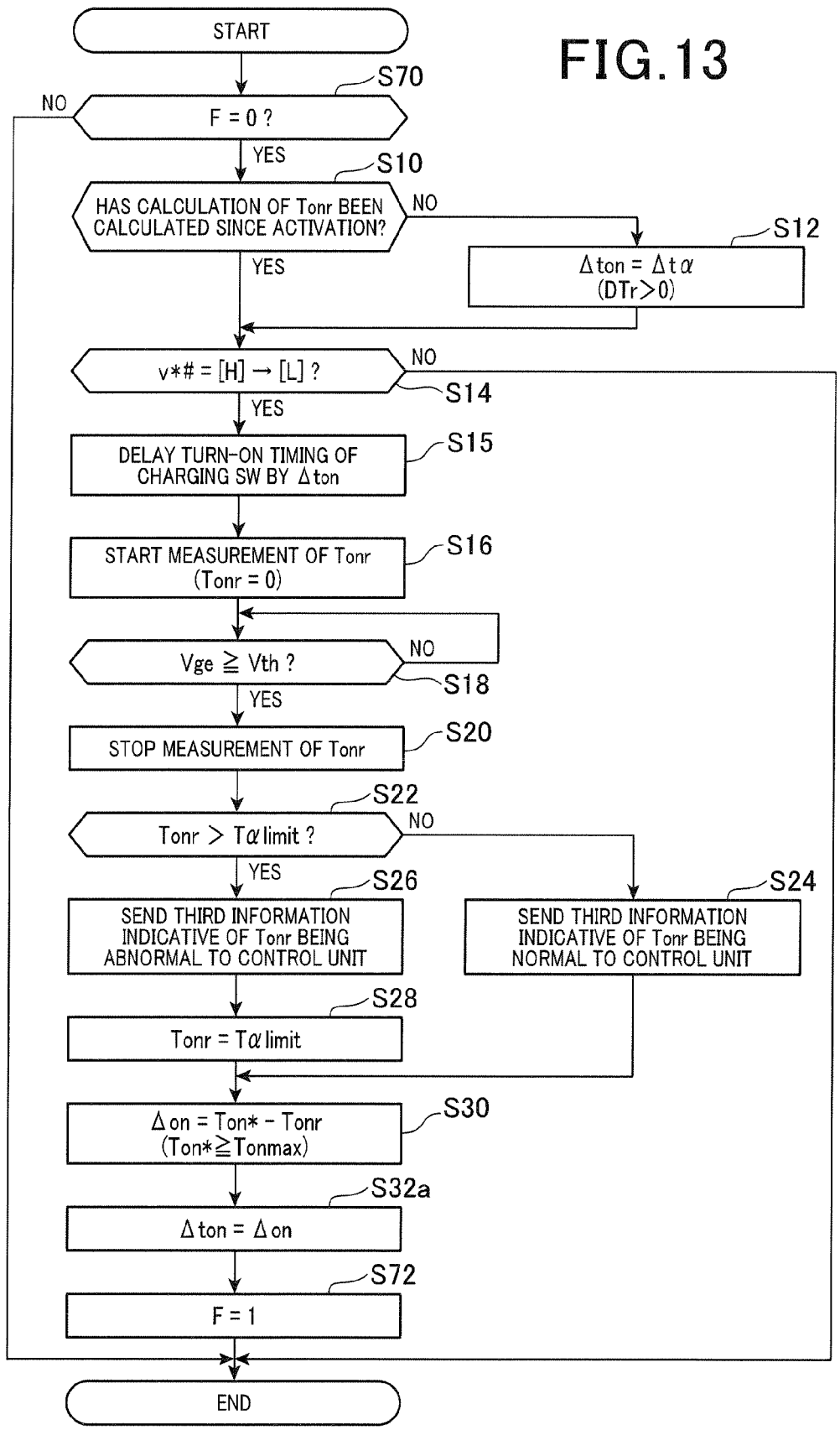
FIG. 13 is a flowchart schematically illustrating an example of a first delay-time adjusting task carried out by each drive unit of a control system according to a third embodiment of the present disclosure.

The drive controller 34 of the drive unit DU provided for each switching element S*# according to the third embodiment is configured to perform a first delay-time adjusting task according to the second embodiment illustrated in FIG. 13.

Steps in the routine illustrated in FIG. 13 identical to corresponding steps in the routine illustrated in FIG. 5, to which like reference characters are assigned, are omitted or simplified in description to avoid redundant description. Note that the drive controller 34 of each drive unit DU according to the third embodiment can be configured as a programmed logic unit, a hard-wired logic unit, or the combination of hard-wired-logic and programmed-logic hybrid units, and can repeatedly carry out the first delay-time adjusting task illustrated in FIG. 13 every preset cycle as an example.

Referring to FIG. 13, when starting the first delay-time adjusting task, the drive controller 34 determines whether a determination flag F stored therein beforehand is set to 0. The determination flag is a bit having a logical low value, represented by 0, or a logical high value, represented by 1. An initial value of the completion flag F is set to 0 each time the inverter IV is activated. Specifically, the determination flag F being set to 0 represents that determination of the on correction value Δton has not been completed yet, and the determination flag F being set to 1 represents that determination of the on correction value Δton has been already completed.

Upon determination that the determination flag F stored therein beforehand is set to 0 (YES in step S70), the first delay-time adjusting task proceeds to step S10. Thereafter, the drive controller 34 performs the operations in steps S10 to S30 in the same procedure as those illustrated in FIG. 4.

After completion of the operation in step S30, the drive controller 34 determines the on deviation Δon calculated in step S30 as the on correction value Δton in step S32a.

Following the operation in step S32a, the drive controller 34 sets the determination flag F to 1 in step S72, and terminates the first delay-time adjusting task.

In the third embodiment, the second delay-time adjusting task illustrated in FIG. 8 is modified based on the additional steps S70 and S72 and the modified step S32a illustrated in FIG. 13.

Other structures and functions of the control system according to the third embodiment are identical to those of the control system 100 according to the first embodiment.

The drive unit DU provided for each switching element S*# according to the third embodiment is configured to:

measure, as the on delay period Tonr, time required for the gate voltage Vge of the target switching element S*# to have increased to reach the threshold voltage Vth since the reverse of the drive signal v*# to the low level each time the inverter INV is activated;

adjust the on delay period Tonr for each on-switching cycle based on the measured on delay period Tonr such that the adjusted on delay period Tonr matches with an on command value Ton* for the on delay period Tonr;

measure, as the off delay period Toffr, time required for the gate voltage Vge of the target switching element S*# to have decreased to reach the threshold voltage Vth since the reverse of the drive signal v*# to the high level each time the inverter INV is activated; and adjust the off delay period Toffr for each off-switching cycle based on the measured off delay period Toffr such that the adjusted off delay period Toffr matches with an off command value Toff* for the off delay period Toffr.

This configuration reduces variations in the on delay period Tonr and the off delay time Toffr for each on-off switching cycle due to the variations in the characteristics of the individual switching elements S*#. This configuration also achieves adjustment of the on delay period Tonr and the off delay period Toffr for each on-off switching cycle more simply in comparison to the routine illustrated in FIG. 4 and/or FIG. 8.

Fourth Embodiment

A control system for controlling the motor-generator 10 according to a fourth embodiment of the present disclosure will be described with reference to FIG. 14.

The structure and/or functions of the control system according to the fourth embodiment are mainly identical to those of the control system 100 according to the first embodiment except for the following points. So, the different points will be mainly described hereinafter.

Figure 14:
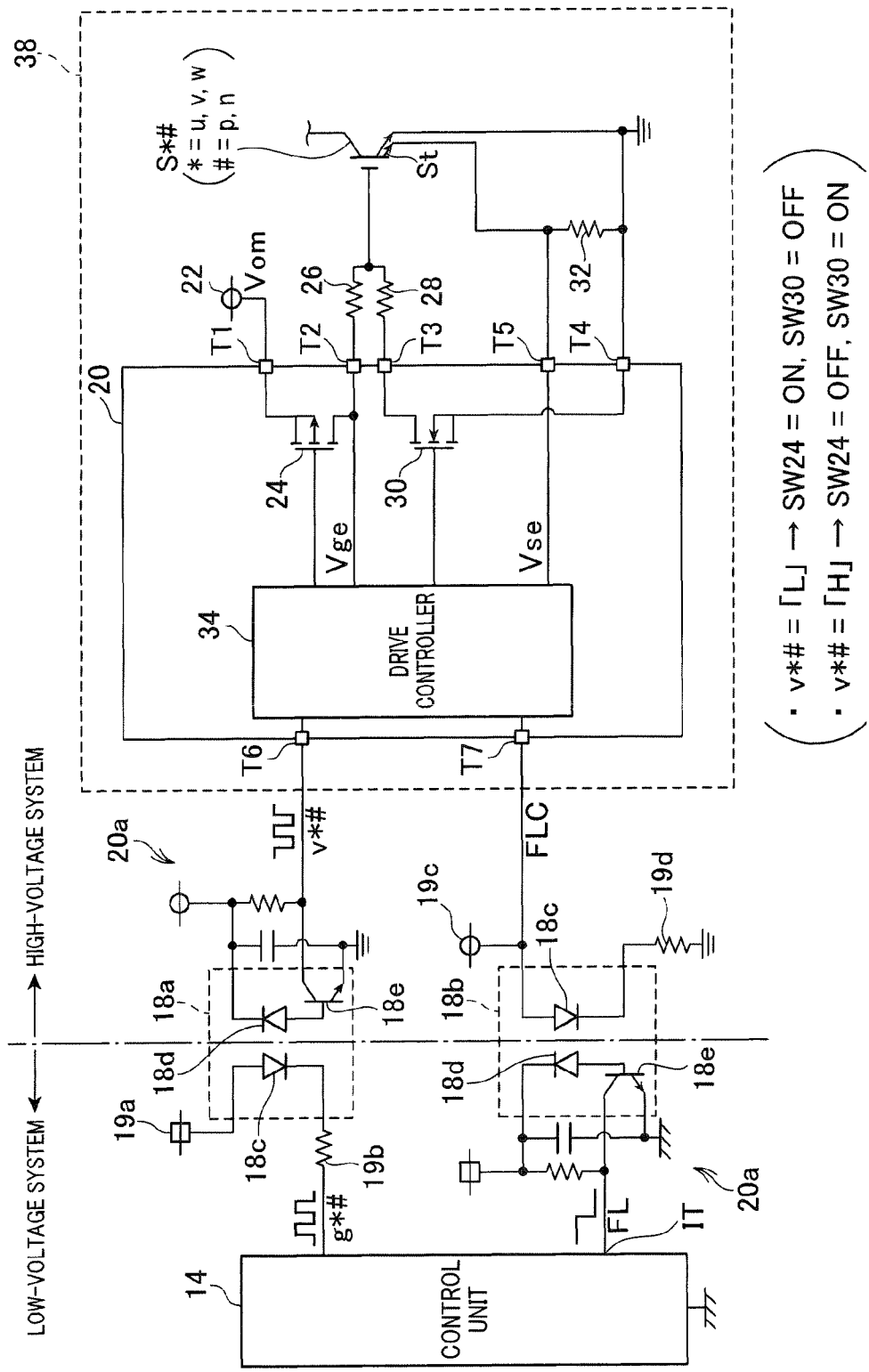
FIG. 14 is a circuit diagram schematically illustrating an example of the structure of each drive unit of a control system according to a fourth embodiment of the present disclosure.

FIG. 14 schematically illustrates each switching module 38 in which a corresponding switching element S*#, the charging and discharging resistors 26 and 28, the constant-voltage power source 22, and the sense resistor 32, and the drive IC 20 are integrally installed. In FIG. 14, elements identical to corresponding elements illustrated in FIG. 2, to which like reference characters are assigned, are omitted or simplified in description to avoid redundant description.

Other structures and functions of the control system according to the fourth embodiment are identical to those of the control system 100 according to the first embodiment.

Each switching module 38 incorporating therein a corresponding switching element S*# is capable of achieving the same technical effects as those achieved by the control system 100 according to the first embodiment.

Particularly, because each switching module 38 incorporates therein a corresponding switching element S*#, the charging and discharging resistors 26 and 28, and the drive IC 20, it is difficult to add circuit elements to adjust the values of the charging and discharging resistors 26 and 28 to adjust the on delay period Tonr and the off delay period Toffr. Thus, the drive IC 20 having the aforementioned function of adjusting the on delay period Tonr and the off delay period Toffr according to the present disclosure is effectively used for such a switching module.

Each of the first to fourth embodiments of the present disclosure can be modified as described hereinafter.

In each of the first to fourth embodiments, the drive IC 20 can be designed such that the high voltage system and the low voltage system are separated from each other therein. In this modification, the first photocoupler 18a with the first pull-up/down circuit 20a and the second photocoupler 18b with the second pull-up/down circuit 20b are provided in each drive IC 20.

In each of the first to fourth embodiments of the present disclosure, an adjusting module that performs the first and second delay-time adjusting tasks is installed in the drive IC 20, but can be installed in the control unit 14 as a first modification. In the first modification, as illustrated in FIG. 2 using a phantom line, a transferring unit, such as a photocoupler, 18c for transferring the gate voltage Vge of the switching element S*# to the control unit 14 while electrically isolating the drive unit DU and the control unit 14.

In the first modification, the control unit 14 is configured to measure a value as the on delay period Tonr from a time at which the drive signal g*# output therefrom to the drive unit DU is switched to the on command for a current on-switching cycle to a time at which the gate voltage Vge transferred from the drive unit DU thereto via the transferring unit 18c increases to reach the threshold voltage Vth (see steps S14 to S20). Then, the control unit 14 is configured to calculate the on correction value Δton based on the measured on delay period Tonr (see steps S22 to S32), and adjust the timing to switch the drive signal g*# to the on command for the next on-switching cycle based on the on correction value Δton, thus adjusting the on delay period Tonr for the next on-switching cycle to the on command value Ton* (see step S15).

In addition, in the first modification, the control unit 14 is configured to measure a value as the off delay period Toffr from a time at which the drive signal g*# output therefrom to the drive unit DU is switched to the off command for a current off-switching cycle to a time at which the gate voltage Vge transferred from the drive unit DU thereto via the transferring unit 18c decreases to reach the threshold voltage Vth (see steps S44 to S50). Then, the control unit 14 is configured to calculate the off correction value Δtoff based on the measured off delay period Toffr (see steps S52 to S62), and adjust the timing to switch the drive signal g*# to the off command for the next off-switching cycle based on the off correction value Δtoff, thus adjusting the off delay period Toffr for the next off-switching cycle to the off command value Toff* (see step S45).

In the first modification, the control unit 14 can be configured to transfer, to the drive unit DU, information associated with the on delay period Tonr and/or the off delay period Toffr while the information is added to or superimposed on the drive signal g*# via the first photocoupler 18a (see steps S24 and S26). Thus, the drive unit DU can be configured to adjust each of the on delay period Tonr and the off delay period Toffr for a corresponding one of the next on- and off-switching cycle based on a corresponding one of the on delay period Tonr and the off delay period Toffr transferred from the control unit 14.

In the first embodiment, a measuring module configured to measure each of the on delay period Tonr and the off delay period Toffr based on the gate voltage Vge can be modified as follows. For example, a measuring module according to a second modification can be configured to measure the on delay period Tonr from a first time at which the drive signal v*# is switched to the on command to a second time at which the gate voltage Vge starts to increase (see time t11a in FIG. 5). At that time, the measuring module can be configured to determine whether it is the second time using a threshold voltage slightly higher than a zero level. Similarly, the measuring module according to the second modification can be configured to measure the off delay period Toffr from a third time at which the drive signal v*# is switched to the off command to a fourth time at which the gate voltage Vge starts to decrease as the off delay period Toffr. At that time, the measuring module can be configured to determine whether it is the fourth time using a threshold voltage slightly lower than the terminal voltage Vom of the constant-voltage power source 22.

In the second embodiment, a measuring module configured to measure each of the on delay period Tonr and the off delay period Toffr based on the sense voltage Vse can be modified as follows. For example, a measuring module according to a third modification can be configured to measure the on delay period Tonr from a first time at which the drive signal v*# is switched to the on command to a second time at which the sense voltage Vse starts to increase (see time t51b in FIG. 11). At that time, the measuring module can be configured to determine whether it is the second time using a threshold voltage slightly higher than a zero level. Similarly, the measuring module according to the third modification can be configured to measure the off delay period Toffr from a third time at which the drive signal v*# is switched to the off command to a fourth time at which the sense voltage Vse decreases down to zero. That is, at that time, the measuring module can be configured to determine whether it is the fourth time using a threshold voltage being set to zero.

A measuring module according to the present disclosure is not limited to the structure designed to measure the on delay period Tonr and the off delay period Toffr using the gate voltage Vge or the sense voltage Vse. Specifically, a measuring module according to a fourth modification can be configured to measure the on delay period Tonr and the off delay period Toffr using the collector-emitter voltage of the switching element S*#. In this modification, as illustrated in FIG. 2 as a phantom line, a sensor 70 can be provided for each switching element S*#, and can be operative to measure the collector-emitter voltage of the switching element S*#. In this modification, the drive controller 34 can be configured to measure the on delay period Tonr from a first time at which the drive signal v*# is switched to the on command to a second time at which the collector-emitter voltage Vce starts to decrease. Similarly, in this modification, the drive controller 34 can be configured to measure the off delay period Toffr from a third time at which the drive signal v*# is switched to the off command to a fourth time at which the collector-emitter voltage Vce starts to increase.

In each of the first to fourth embodiments, the on command value Ton* and the off command value Toff* can be equal to each other or different from each other.

In the fourth embodiment, the first photocoupler 18a and the second photocoupler 18b can be integrally installed in the switching module 38. Because each switching module 38 according to this modification incorporates therein a corresponding switching element S*#, the charging and discharging resistors 26 and 28, the drive IC 20, and the first and second photocouplers 18a and 18b, it is difficult to add, for example, a delay circuit between the sixth terminal T6 and the first photocoupler 18a. Thus, the drive IC 20 having the aforementioned function of adjusting the on delay period Tonr and the off delay period Toffr according to the present disclosure is effectively used for such a switching module according to this modification.

The light electrical-insulation devices, such as the first and second photocouplers, can be used as means for communicating between the high voltage system and the low voltage system while establishing electrical insulation therebetween, but magnetic electrical-insulation devices, such as pulse transformers, can be used as means for communicating between the high voltage system and the low voltage system while establishing electrical insulation therebetween.

In each of the first to fourth embodiments, the high-voltage battery 12 serves as a DC power source, but the present disclosure is not limited thereto. Specifically, if a step-up converter is provided between the high-voltage battery 12 and the inverter IV for boosting the terminal voltage of the high-voltage battery 12, and supplying the boosted terminal voltage to the inverter IV, the step-up converter can serve as the DC power source.

In each of the first to fourth embodiments, an IGBT is used as a switching element S*# of each drive unit DU, but a MOSFET can be used as a switching element S*# of each drive unit DU. In each of the first to fourth embodiments, the power converter provided with series-connected high- and low-side switching elements is not limited to the three-phase inverter IV. A half-bridge circuit or a full-bridge circuit provided with series-connected high- and low-side switching elements can be used as the power converter according to the present disclosure.

While illustrative embodiments of the present disclosure have been described herein, the present disclosure is not limited to the embodiment described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A driving system for driving series-connected high- and low-side switching elements of a power converter to alternately turn on the series-connected high- and low-side switching elements with a dead time between on states of the respective high- and low-side switching elements, the driving system comprising:
    an applying module configured to apply, in response to an input of one of an on command and an off command as a switching command, a switch signal to a target switching element as one of the high- and low-side switching elements to switch the target switching element to be in one of an on state and an off state corresponding to the switching command;
    a measuring module configured to measure a delay period defined as a time interval from a first time to a second time,
    the first time representing a time at which the switching command is switched from one of the on command and the off command to the other thereof,
    the second time representing a time at which the target switching element is actually switched to be in one of the on state and off state corresponding to the switching command;
    an adjusting module configured to adjust, as a function Of the delay period, an input timing of a next switch signal applied from the applying module to the target switching element;
    a first circuit region;
    a second circuit region electrically isolated from the first circuit region;
    a drive-signal generator provided in the first circuit region and configured to generate the switching command and output the switching command; and
    a transferring module configured to transfer the switching command output from the drive-signal generator to the second circuit region while establishing electrical isolation between the first and second circuit regions,
    the applying module being provided in the second circuit region and configured to apply, based on the switching command transferred from the transferring module, the switch signal to the target switching element to switch the target switching element to be in one of the on state and off state corresponding to the switching command,
    the measuring module being provided in the second circuit region and configured to measure the delay period defined as the time interval from the first time to the second time,
    the adjusting module being configured to adjust, as the function of the delay period, the input timing of the next switch signal to the target switching element to a predetermined reference timing.

2. The driving system according to claim 1, wherein:
    the applying module is configured to apply, in response to an input of one of the on command and the off command as the switching command for each predetermined cycle, the switch signal to the target switching element to switch the target switching element to be in one of the on state and off state corresponding to the switching command;
    the measuring module is configured to measure, at one cycle of the predetermined cycles as a first cycle, the delay period defined as the time interval from the first time to the second time; and the adjusting module is configured to adjust, as the function of the delay period measured at the first cycle, the input timing of the next switch signal to the target switching element to the predetermined reference timing.

3. The driving system according to claim 1, wherein:

the measuring module is configured to measure, at a time when the power converter is activated, the delay period defined as the time interval from the first time to the second time; and the adjusting module is configured to adjust, as the function of the delay period measured at the time when the power converter is activated, the input timing of the next switch signal to the target switching element to the predetermined reference timing.

4. The driving system according to claim 2, wherein, when the measuring module is configured to measure, at a start cycle in the predetermined cycles as a first cycle, the delay period defined as the time interval from the first time to the second time, the adjusting module is configured to:

adjust, as the function of the delay period measured at the first cycle, the input timing of the next switch signal to the target switching element such that the dead time between the target switching element as one of the high- and low-side switching elements and the other thereof is longer than zero.

5. The driving system according to claim 1, wherein the predetermined reference time is set to be equal to or greater than an upper limit of the delay period; and the upper limit of the delay period could be measured by the measuring module if the input timing of the next switch signal applied to the target switching element was not adjusted.

6. The driving system according to claim 1, wherein the adjusting module comprises:

a determining module configured to determine whether the delay period measured by the measuring module has exceeded the upper limit; and a limiting module configured to limit the delay period measured by the measuring module to the upper limit if it is determined that the delay period measured by the measuring module has exceeded the upper limit.

7. The driving system according to claim 1, wherein the transferring module is a first transferring module, the driving system further comprising:

a second transferring module configured to transfer the delay period measured by the measuring module from the second circuit region to the first circuit region while establishing electrical isolation between the first and second circuit regions; and a diagnosing module configured to diagnose, based on the delay period transferred from the second transferring module, whether there is an abnormality associated with adjustment of the input timing to the predetermined reference timing by the adjusting module.

8. The driving system according to claim 1, wherein the second transferring module is configured to send, from the second circuit region to the first circuit region, a signal indicative of whether there is an abnormality associated with the target switching element.

9. The driving system according to claim 1, wherein the target switching element, the applying module, the measuring module, and the adjusting module are integrated with each other in an IC circuit.

10. The driving system according to claim 1, wherein:

the target switching element has an input terminal, an output terminal, a conductive path defined between the input and output terminals, and a sense terminal for outputting a sense current associated with a current flowing through the conductive path; and the measuring module is configured to measure a time interval taken from the first time to a third time as the delay period for turning on the target switching element, the first time representing the time at which the switching command is switched from the off command to the on command, the third time representing a time at which a parameter associated with the sense current increases up to a first threshold.

11. The driving system according to claim 1, wherein:

the target switching element has an input terminal, an output terminal, a conductive path defined between the input and output terminals, and a sense terminal for outputting a sense current associated with a current flowing through the conductive path; and the measuring module is configured to measure a time interval taken from the first time to a fourth time as the delay period for turning off the target switching element, the first time representing the time at which the switching command is switched from the on command to the off command, the fourth time representing a time at which a parameter associated with the sense current decreases down to a second threshold.

12. The driving system according to claim 1, wherein:

the target switching element has a control terminal, the applying module being configured to increase a level of a voltage signal applied as the switch signal to the control terminal up to a first threshold, so that the target switching element is turned on; and the measuring module is configured to measure a time interval taken from the first time to a third time as the delay period for turning on the target switching element, the first time representing the time at which the switching command is switched from the off command to the on command, the third time representing a time at which the level of the voltage signal increases up to the first threshold.

13. The driving system according to claim 1, wherein:

the target switching element has a control terminal, the applying module being configured to decrease a level of a voltage signal applied as the switch signal to the control terminal down to a second threshold, so that the target switching element is turned off; and the measuring module is configured to measure a time interval taken from the first time to a fourth time as the delay period for turning off the target switching element, the first time representing the time at which the switching command is switched from the on command to the off command, the fourth time representing a time at which the level of the voltage signal decreases down to the second threshold.

* * * * *